(12) United States Patent
Hashii

(10) Patent No.: US 11,165,189 B2
(45) Date of Patent: Nov. 2, 2021

(54) WATERPROOF CONNECTOR AND METHOD OF ASSEMBLING SAME

(71) Applicant: Mitsubishi Electric Corporation, Tokyo (JP)

(72) Inventor: Naoya Hashii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/649,875

(22) PCT Filed: Oct. 19, 2017

(86) PCT No.: PCT/JP2017/037884
§ 371 (c)(1),
(2) Date: Mar. 23, 2020

(87) PCT Pub. No.: WO2019/077722
PCT Pub. Date: Apr. 25, 2019

(65) Prior Publication Data
US 2020/0259290 A1   Aug. 13, 2020

(51) Int. Cl.
*H01R 13/46* (2006.01)
*H01R 13/52* (2006.01)
(Continued)

(52) U.S. Cl.
CPC ......... *H01R 13/5202* (2013.01); *H01R 12/58* (2013.01); *H01R 13/521* (2013.01); *H05K 5/0052* (2013.01); *H05K 5/0069* (2013.01)

(58) Field of Classification Search
CPC .... H01R 13/5205; H01R 13/52; H01R 13/46; H01R 13/521; H01R 12/52; H01R 12/50; H01R 12/58
(Continued)

(56) References Cited

U.S. PATENT DOCUMENTS 4,676,575 A * 6/1987 Denlinger .......... H01R 13/5219
                                                                439/271
6,113,424 A * 9/2000 Shinozaki .......... H01R 13/5202
                                                                439/556
(Continued)

FOREIGN PATENT DOCUMENTS

CN      103138102 A    6/2013
JP      2009-009845 A  1/2009

OTHER PUBLICATIONS

Communication dated Jan. 6, 2021 from the National Intellectual Property Office of the P.R. of China in Application No. 201780095699.6.
(Continued)

*Primary Examiner* — Harshad C Patel
(74) *Attorney, Agent, or Firm* — Sughrue Mion, PLLC; Richard C. Turner

(57) ABSTRACT

Provided is a waterproof connector, with which waterproof performance can be improved. The waterproof connector includes a connector main body, which is mounted on a circuit board provided inside a housing, and is to be inserted into a housing connector hole formed in the housing; an annular seal member, which is provided outside the housing, and surrounds the connector main body; a bracket, which is provided to the housing, and is configured to presses the annular seal member against the housing; and fasteners configured to fix the bracket to the housing. The annular seal member is held in contact with a connector main body sealing surface and a housing sealing surface to close a gap between the housing and the connector main body.

13 Claims, 21 Drawing Sheets

(51) Int. Cl.
  *H01R 12/58* (2011.01)
  *H05K 5/00* (2006.01)
(58) Field of Classification Search
  USPC .......................................................... 439/587
  See application file for complete search history.

(56) References Cited

U.S. PATENT DOCUMENTS

| | | | | |
|---|---|---|---|---|
| 8,066,518 | B2 * | 11/2011 | Homme | H02G 3/088 |
| | | | | 439/78 |
| 8,167,634 | B2 * | 5/2012 | Fujiwara | H01R 13/748 |
| | | | | 439/271 |
| 8,262,413 | B2 * | 9/2012 | Fujiwara | H01R 13/6596 |
| | | | | 439/607.28 |
| 8,979,554 | B2 * | 3/2015 | Yudate | H01R 13/5202 |
| | | | | 439/76.1 |
| 9,343,941 | B2 * | 5/2016 | Okamoto | H02K 11/33 |
| 10,038,287 | B2 * | 7/2018 | Yamada | H01R 24/66 |
| 10,062,986 | B2 * | 8/2018 | Shibaya | H01R 12/724 |
| 10,367,292 | B2 * | 7/2019 | Furuya | H01R 13/5202 |
| 2013/0171854 | A1 * | 7/2013 | Homme | H01R 13/5219 |
| | | | | 439/272 |
| 2015/0099385 | A1 * | 4/2015 | Ikeya | H01R 12/724 |
| | | | | 439/271 |
| 2015/0180159 | A1 * | 6/2015 | Endo | H01R 13/516 |
| | | | | 439/587 |
| 2016/0226347 | A1 * | 8/2016 | Okamoto | H02K 3/28 |
| 2018/0076561 | A1 * | 3/2018 | Aoshima | H01R 13/648 |

OTHER PUBLICATIONS

International Search Report for PCT/JP2017/037884 dated Oct. 24, 2017 [PCT/ISA/210].

Written Opinion for PCT/JP2017/037884 dated Oct. 24, 2017 [PCT/ISA/237].

* cited by examiner

WATERPROOF CONNECTOR AND METHOD OF ASSEMBLING SAME

CROSS REFERENCE TO RELATED APPLICATIONS

This application is a National Stage of International Application No. PCT/JP2017/037884 filed Oct. 19, 2017.

TECHNICAL FIELD

The present invention relates to a waterproof connector to be mounted on a circuit board and a method of assembling the same.

BACKGROUND ART

There has been known a waterproof connector including a connector main body and a cover member. The connector main body is provided inside a housing, and is mounted on a circuit board. The cover member is inserted into a housing connector hole of the housing into which a mating connector is to be inserted. The cover member is provided over the housing and the connector main body. The cover member includes a cylindrical portion and a flange-shaped portion. The cylindrical portion is inserted into the housing connector hole so as to be fitted into the connector main body. The flange-shaped portion is provided outside the housing, and extends along an outer surface of the housing. The waterproof connector further includes an inner seal member and an outer seal member. The inner seal member is configured to close a gap between the cylindrical portion and the connector main body. The outer seal member is configured to close a gap between the flange-shaped portion and a peripheral edge portion of the housing connector hole in the housing (see, for example, Patent Literature 1).

CITATION LIST

Patent Literature

[PTL 1] JP 2009-9845 A

SUMMARY OF INVENTION

Technical Problem

However, the cylindrical portion of the cover member is inserted into the housing connector hole into which the mating connector is to be inserted. With the insertion of the cylindrical portion, a dimension of the housing connector hole is increased. Thus, a circumferential length of the outer seal member configured to close the gap between the flange-shaped portion and the outer surface of the housing is increased. As a result, there arises a problem in that waterproof performance of the waterproof connector is lowered.

The present invention has been made to solve the problem described above, and has an object to provide a waterproof connector and a method of assembling the same, with which water-proof performance can be improved.

Solution to Problem

According to one embodiment of the present invention, there is provided a waterproof connector, including: a connector main body, which is mounted on a circuit board provided inside a housing, and is to be inserted into a housing connector hole formed in the housing; an annular seal member, which is provided outside the housing, and surrounds the connector main body; and a bracket, which is provided to the housing, and is configured to press the annular seal member against the housing, wherein the annular seal member is held in contact with a connector main body sealing surface of the connector main body and a housing sealing surface of the housing to close a gap between the housing and the connector main body.

Advantageous Effects of Invention

With the waterproof connector according to one embodiment of the present invention, the annular seal member is held in contact with each of the connector main body sealing surface and the housing sealing surface to close the gap between the housing and the connector main body. In this manner, only the connector main body is inserted into the housing connector hole. Thus, a dimension of the housing connector hole can be reduced. As a result, a circumferential length of the annular seal member can be reduced. With the reduction of the circumferential length, the waterproof performance of the waterproof connector can be improved.

DESCRIPTION OF EMBODIMENTS

First Embodiment

Figure 1:
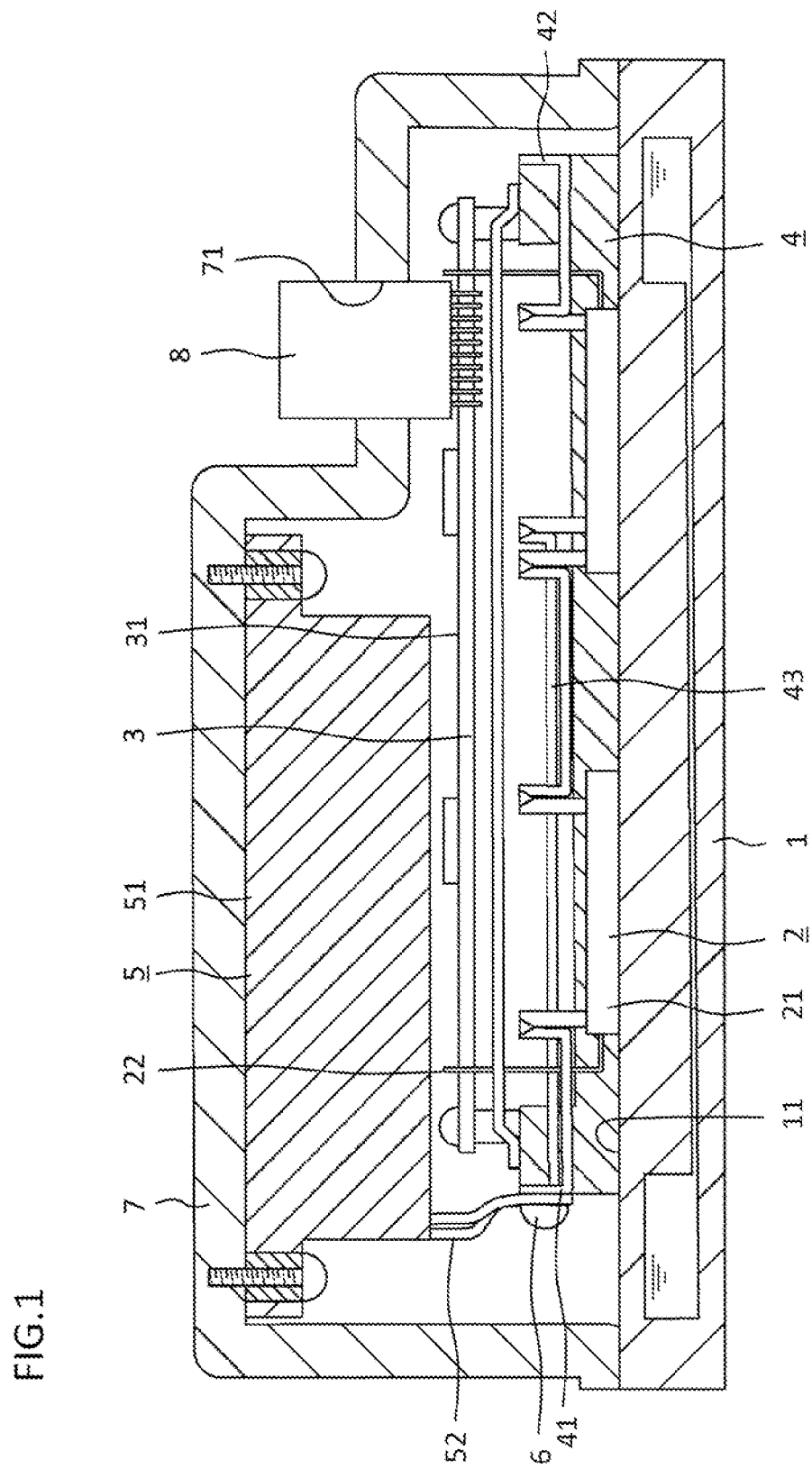
FIG. 1 is a longitudinal sectional view for illustrating a power conversion equipment including a waterproof connector according to a first embodiment of the present invention.

FIG. 1 is a longitudinal sectional view for illustrating a power conversion equipment including a waterproof connector according to a first embodiment of the present invention. A power conversion equipment is described as an example of an electronic device including a waterproof connector. The power conversion equipment includes a water-cooling heat sink 1, a power semiconductor element 2, and a circuit board 3. The power semiconductor element 2 is held in surface contact with a surface 11 of the water-cooling heat sink 1. The circuit board 3 is configured to control drive of the power semiconductor element 2.

The power semiconductor element 2 includes an element main body 21 and a relay terminal 22. The relay terminal 22 extends from the element main body 21. The circuit board 3 is arranged so as to be opposed to the element main body 21. The relay terminal 22 is electrically connected to the circuit board 3.

The power conversion equipment further includes a support case 4 made of a resin, which is provided between the water-cooling heat sink 1 and the circuit board 3. The support case 4 includes an input terminal 41 for a direct current, an output terminal 42 for an alternating current, and a bus bar 43. The input terminal 41 is to be electrically connected to the power semiconductor element 2. The bus bar 43 is configured to electrically connect the input terminal 41 and the output terminal 42 to each other. The support case 4 is formed through insert-molding of the input terminal 41, the output terminal 42, and the bus bar 43.

A surface of the circuit board 3 on a side opposite to the support case 4 is a mounting surface 31. The power conversion equipment includes a smoothing capacitor 5 and a screw 6. The smoothing capacitor 5 is arranged so as to be opposed to the mounting surface 31. The screw 6 is configured to electrically connect the smoothing capacitor 5 and the input terminal 41 to each other. The smoothing capacitor 5 includes a capacitor main body 51 and a bus bar 52. The bus bar 52 extends from the capacitor main body 51 to the input terminal 41.

The power conversion equipment further includes a housing 7 made of a metal, which is to be fixed to the water-cooling heat sink 1. The power semiconductor element 2, the circuit board 3, the support case made of a resin, and the smoothing capacitor 5 are accommodated with high efficiency in a space surrounded by the water-cooling heat sink 1 and the housing 7.

A housing connector hole 71 is formed in the housing 7. The power conversion equipment further includes a waterproof connector 8 mounted on the mounting surface 31 of the circuit board 3. The waterproof connector 8 is inserted into the housing connector hole 71. A part of the waterproof connector 8 is located outside the housing 7. A mating connector (not shown) is to be connected to the waterproof connector 8.

Figure 2:
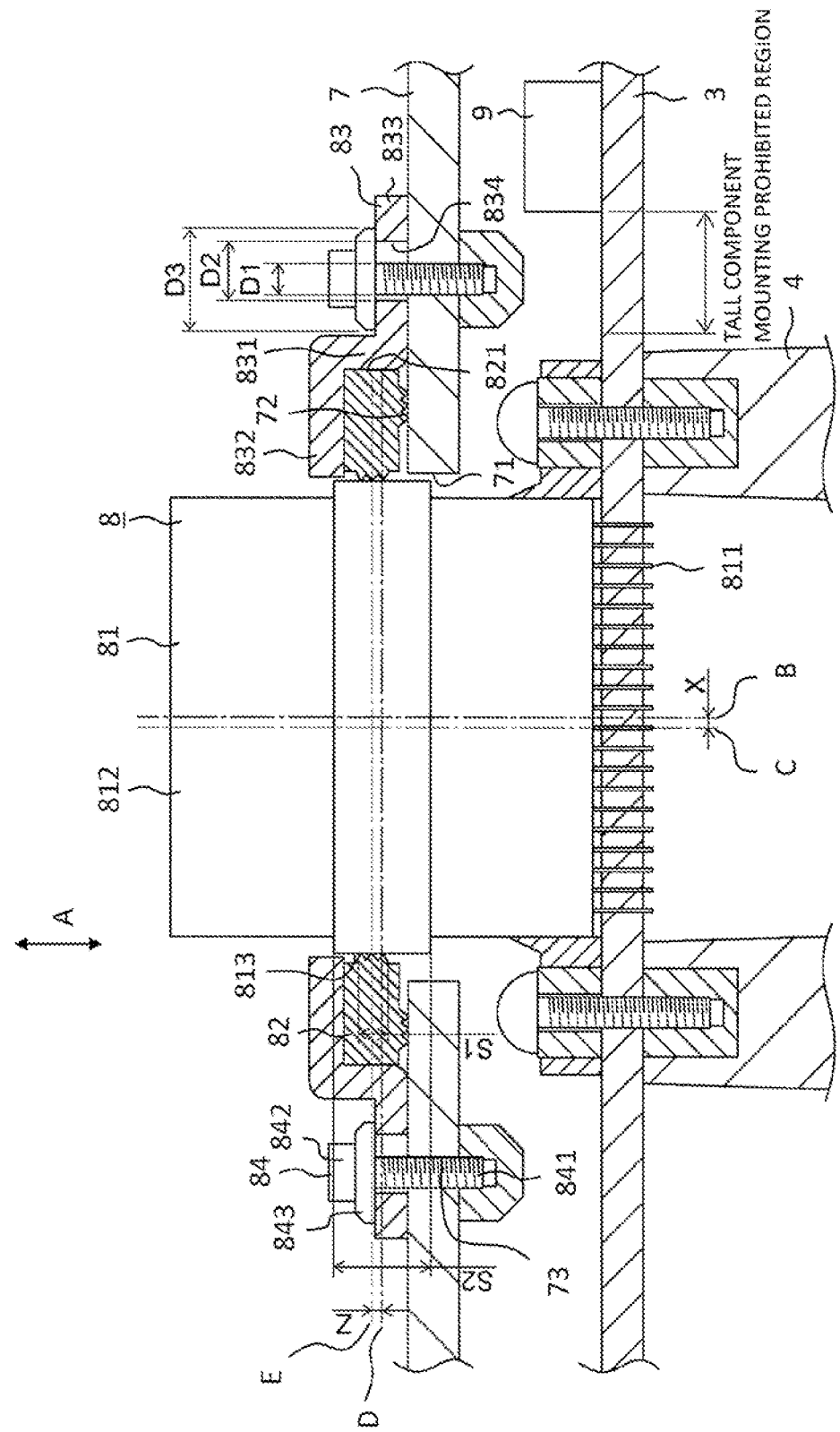
FIG. 2 is a longitudinal sectional view for illustrating a main part of the power conversion equipment of FIG. 1.

FIG. 2 is a longitudinal sectional view for illustrating a main part of the power conversion equipment of FIG. 1. The waterproof connector 8 includes a connector main body 81, an annular seal member 82, a bracket 83, and a plurality of fasteners 84. The annular seal member 82 is provided outside the housing 7, and surrounds the connector main body 81. The bracket 83 is configured to press the annular seal member 82 against the housing 7. The plurality of fasteners 84 are configured to fix the bracket 83 to the housing 7. In this example, the annular seal member 82 is assembled to the bracket 83. The annular seal member 82 and the bracket 83 may be formed by integral molding through baking.

The connector main body 81 includes a plurality of terminals 811 and a housing 812 made of a resin. The plurality of terminals 811 are to be electrically connected to the mating connector. The housing 812 is configured to hold the plurality of terminals 811. The connector main body 81 is arranged so as to extend from the circuit board 3 to an outside of the housing 7. A direction in which the mating connector is attached to and detached from the connector main body 81 is referred to as an attaching and detaching direction A.

The annular seal member 82 is held in contact with a connector main body sealing surface 813. The connector main body sealing surface 813 is a portion of an outer surface of the connector main body 81, which is located outside the housing 7. Further, the annular seal member 82 is held in contact with a housing sealing surface 72. The housing sealing surface 72 is a portion of an outer surface of the housing 7, which is located in a peripheral edge portion of the housing connector hole 71. In this manner, the annular seal member 82 closes a gap between the housing 7 and the connector main body 81.

The annular seal member 82 includes an outer surface 821, which is oriented toward a side opposite to the connector main body 81 in a direction along the housing sealing surface 72. Movement of the annular seal member 82 along the housing sealing surface 72 with respect to the bracket 83 is restricted.

The bracket 83 includes a pair of bracket side-wall portions 831, which sandwich the annular seal member 82 in the direction along the housing sealing surface 72. The bracket 83 includes a pair of bracket flat-plate portions 832. The pair of bracket flat-plate portions 832 are provided to the pair of bracket side-wall portions 831, respectively, and extend from the bracket side-wall portions 831 toward the connector main body 81. Further, the bracket 83 includes a pair of bracket fixing-plate portions 833. The pair of bracket fixing-plate portions 833 are provided to the pair of bracket side-wall portions 831, respectively, and extend from the bracket side-wall portions 831 in a direction away from the connector main body 81. The bracket side-wall portions 831 are opposed to the outer surface 821 of the annular seal member 82 in the direction along the housing sealing surface 72. Further, the bracket side-wall portions 831 are held in contact with the outer surface 821 of the annular seal member 82.

Each of the fasteners 84 is a flanged fastener. Each of the fasteners 84 includes a shaft portion 841, a head portion 842, and a flange portion 843. The shaft portion 841 is to be inserted into a screw hole 73 formed in the housing 7. The head portion 842 is formed at one end in an axial direction of the shaft portion 841. The shaft portion 841 has the flange portion 843. The flange portion 843 is arranged on another end side in the axial direction of the shaft portion 841 with respect to the head portion 842. Further, the flange portion 843 is arranged so as to overlap the head portion 842.

A bracket fastener hole 834 is formed in each of the bracket fixing-plate portions 833. Each of the fasteners 84 is to be inserted into a corresponding one of the bracket fattener holes 834.

A positional shift amount between a center B of the connector main body 81 and a center C of the housing connector hole 71 in the direction along the housing sealing surface 72 is represented by X. An outer diameter of each of the shaft portions 841 is represented by D1. A dimension of each of the bracket fastener holes 834 is represented by D2. An outer diameter of each of the flange portions 843 is represented by D3. In this case, conditions $X<(D2-D1)/2$ and $D2<D3$ are satisfied. In the conditions described above, the member $(D2-D1)/2$ expresses a dimension of a gap between each of the shaft portions 841 and a corresponding one of the bracket fastener holes 834 in the direction along the housing sealing surface 72.

A positional shift amount between a center D of the connector main body sealing surface 813 and a center E of the annular seal member 82 in a direction perpendicular to the housing sealing surface 72 is represented by Z. A dimension of a portion of the annular seal member 82, which is held in contact with the connector main body sealing surface 813, in the direction perpendicular to the housing sealing surface 72 is represented by S1. A dimension of the connector main body sealing surface 813 in the direction perpendicular to the housing sealing surface 72 is represented by S2. In this case, a condition $Z<(S2-S1)/2$ is satisfied.

Figure 3:
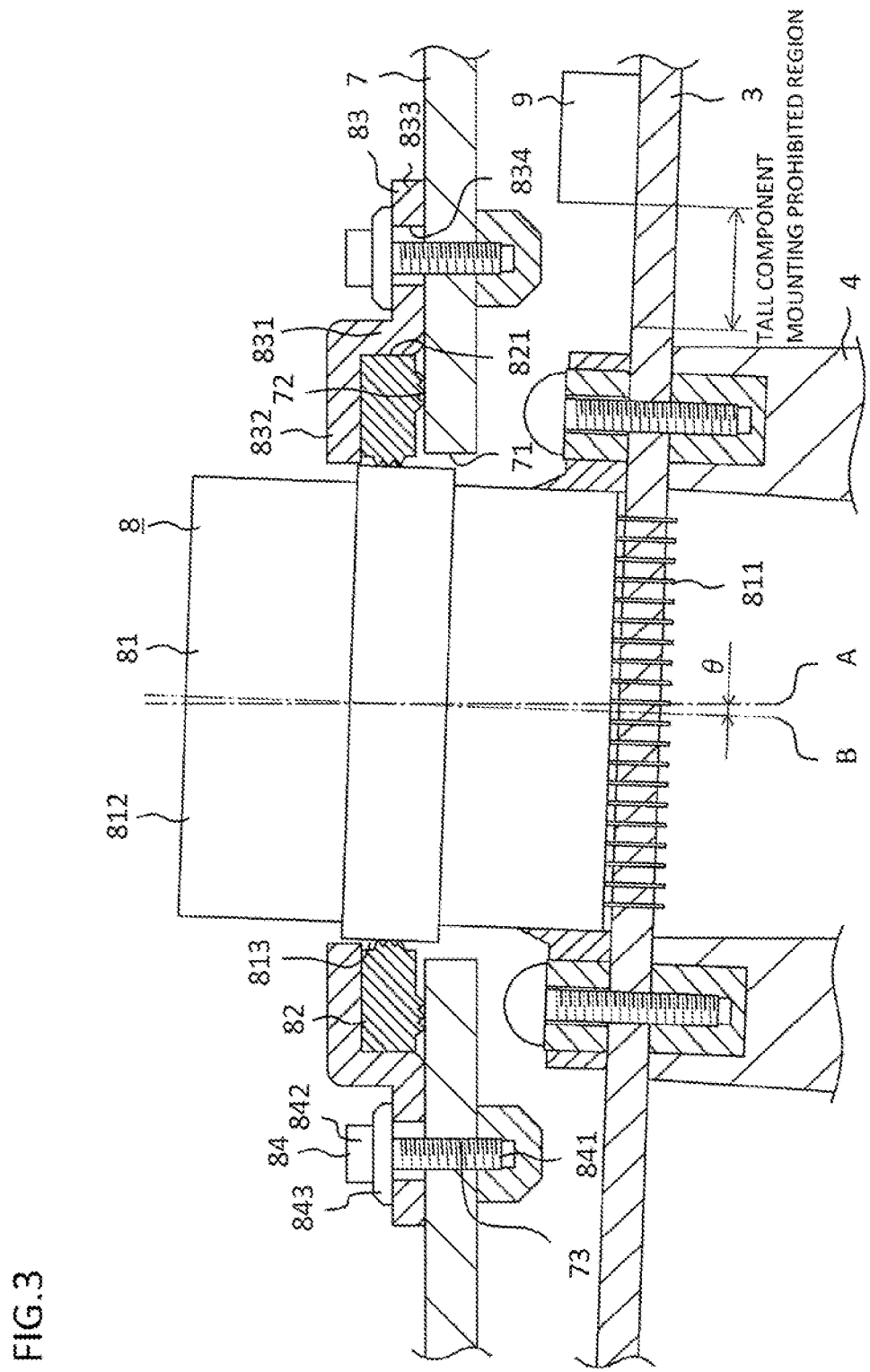
FIG. 3 is a longitudinal sectional view for illustrating a state in which an attaching and detaching direction of FIG. 2 is inclined with respect to a direction perpendicular to a housing sealing surface.

FIG. 3 is a longitudinal sectional view for illustrating a state in which the attaching and detaching direction A is inclined with respect to the direction perpendicular to the housing sealing surface 72. When the circuit board 3 is arranged so as to be inclined with respect to the direction along the housing sealing surface 72, the attaching and detaching direction A is inclined with respect to a direction B perpendicular to the housing sealing surface 72 by θ degrees. In this case, a variation in squeeze in a circumferential direction of the annular seal member 82 occurs in the annular seal member 82. However, an elastic strain of the annular seal member 82 is inversely proportional to a wire diameter of the annular seal member 82. Thus, a variation in squeeze of the annular seal member 82 in the circumferential direction is suppressed by increasing the wire diameter of the annular seal member 82. As a result, the waterproof connector 8 has high sealing performance.

As described above, with the waterproof connector 8 according to the first embodiment of the present invention, the annular seal member 82 is held in contact with each of the connector main body sealing surface 813 and the housing sealing surface 72 to close the gap between the housing 7 and the connector main body 81. In this manner, only the connector main body 81 is inserted into the housing connector hole 71. Thus, a dimension of the housing connector hole 71 can be reduced. As a result, a circumferential length of the annular seal member 82 can be reduced. With the reduction of the circumferential length, the waterproof performance of the waterproof connector 8 can be improved.

Further, the annular seal member 82 is accommodated inside the bracket 83 instead of being accommodated in the connector main body 81. In this manner, the wire diameter of the annular seal member 82 can be increased. The elastic strain of the annular seal member 82 is inversely proportional to the wire diameter of the annular seal member 82. As a result, even when the positional shift amount X between the center B of the connector main body 81 and the center C of the housing connector hole 71 in the direction along the housing sealing surface 72 is increased due to a dimensional tolerance or an assembly error of each of components of the power conversion equipment to thereby increase a variation in squeeze of the annular seal member 82 in the circumferential direction, a variation in squeeze ratio of the annular seal member 82 in the circumferential direction can be suppressed. As a result, the waterproof performance of the waterproof connector 8 can be improved.

Further, even when the positional shift amount Z between the center of the connector main body sealing surface 813 and the center of the annular seal member 82 in the direction perpendicular to the housing sealing surface 72 is large, the annular seal member 82 is not deformed. As a result, the waterproof performance of the waterproof connector 8 can be improved.

Further, even when the attaching and detaching direction A is inclined with respect to the direction B perpendicular to the housing sealing surface 72 to increase a variation in squeeze of the annular seal member 82 in the circumferential direction, a variation in squeeze ratio of the annular seal member 82 in the circumferential direction can be suppressed by increasing the wire diameter of the annular seal member 82. As a result, the waterproof performance of the waterproof connector 8 can be improved.

Further, the connector main body sealing surface 813 is located apart from the circuit board 3, and hence the wire diameter of the annular seal member 82 can be increased. In this manner, generation of vibration in the waterproof connector 8 due to vibration of an engine to which the power conversion equipment is to be mounted or running vibration of a vehicle to which the power conversion equipment is to be mounted can be suppressed. Thus, a stress generated at the terminals 811 can be alleviated. As a result, reliability of the power conversion equipment can be improved.

Further, even when the positional shift amount X is large, the bracket 83 follows the positional shift between the center B of the connector main body 81 and the center C of the housing connector hole 71. As a result, a center of the annular seal member 82 can be matched with the center of the housing connector hole 71. Thus, a variation in squeeze of the annular seal member 82 in the circumferential direction can be suppressed. As a result, the waterproof performance of the waterproof connector 8 can be improved.

Further, a gap between the connector main body sealing surface 813 and a portion of the bracket 83, which is opposed to the connector main body sealing surface 813, can be reduced without being influenced by the positional shift amount X. With the reduction of the gap, even when an internal pressure of the housing 7 becomes high with respect to a pressure of an outside air, protrusion of the annular seal member 82 externally from a gap between the connector main body 81 and the bracket 83 can be suppressed. As a result, the waterproof connector 8 can have high durability against repeated pressure changes.

Further, even when a positional shift between the center of the connector main body sealing surface 813 and the center of the annular seal member 82 occurs in the direction perpendicular to the housing sealing surface 72, the waterproof connector 8 may have high sealing performance. Thus, the waterproof performance of the waterproof connector 8 can be improved.

Second Embodiment

Figure 4:
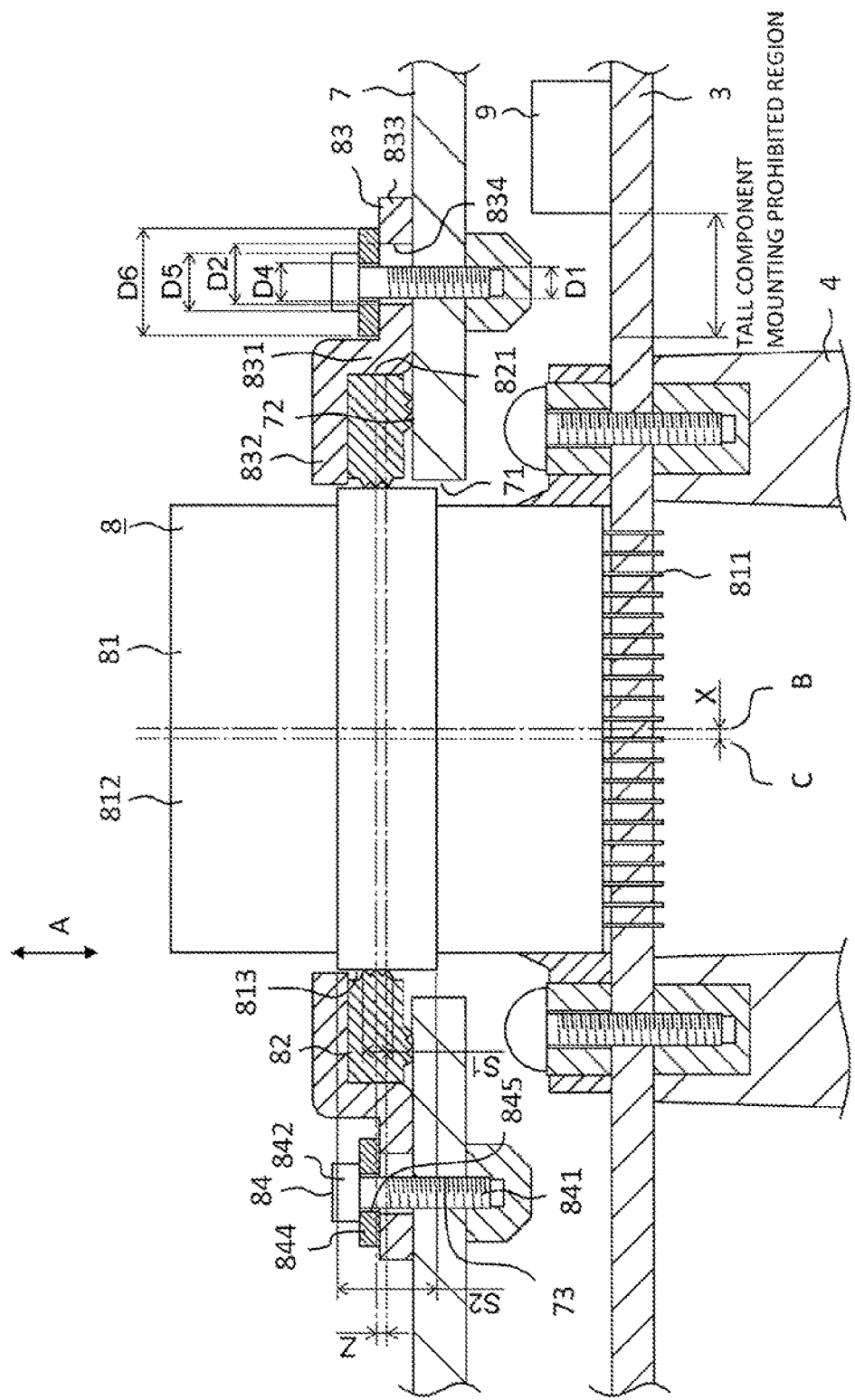
FIG. 4 is a longitudinal sectional view for illustrating a main part of a power conversion equipment including a waterproof connector according to a second embodiment of the present invention.

FIG. 4 is a longitudinal sectional view for illustrating a main part of a power conversion equipment including a waterproof connector according to a second embodiment of the present invention. As each of the fasteners 84, a washer-equipped fastener is used. Each of the fasteners 84 includes the shaft portion 841, the head portion 842, and a washer 844. The shaft portion 841 is to be inserted into a corresponding one of the screw holes 73 formed in the housing 7. The head portion 842 is formed at one end in the axial direction of the shaft portion 841. The washer 844 is provided to the shaft portion 841. In other words, each of the fasteners 84 includes a general-purpose screw including the shaft portion 841 and the head portion 842, and the washer 844 mounted to the general-purpose screw. The washer 844 is arranged on another end side in the axial direction of the shaft portion 841 with respect to the head portion 842. Further, the washer 844 is arranged so as to overlap the head portion 842. A through hole 845, into which the shaft portion 841 is to be inserted, is formed in the washer 844.

A positional shift amount between a center B of the connector main body 81 and a center C of the housing connector hole 71 in the direction along the housing sealing surface 72 is represented by X. An outer diameter of each of the shaft portions 841 of the fasteners 84 is represented by D1. A diameter of each of the bracket fastener holes 834 is represented by D2. An inner diameter of each of the washers 844 is represented by D4. An outer diameter of the head portion 842 of each of the fasteners 84 is represented by D5. An outer diameter of each of the washers 844 is represented by D6. In this case, conditions X<(D2−D1)/2 and D4<D5<D2<D6 are satisfied. Other configurations are the same as those of the first embodiment.

As described above, with the waterproof connector 8 according to the second embodiment of the present invention, even when the positional shift amount X is large, the bracket 83 follows the positional shift between the center B of the connector main body 81 and the center C of the housing connector hole 71. As a result, a center of the annular seal member 82 can be matched with the center of the housing connector hole 71. Further, each of the fasteners 84 includes the general-purpose screw of low cost. With the fasteners described above, cost reduction of the waterproof connector 8 can be achieved.

Third Embodiment

Figure 5:
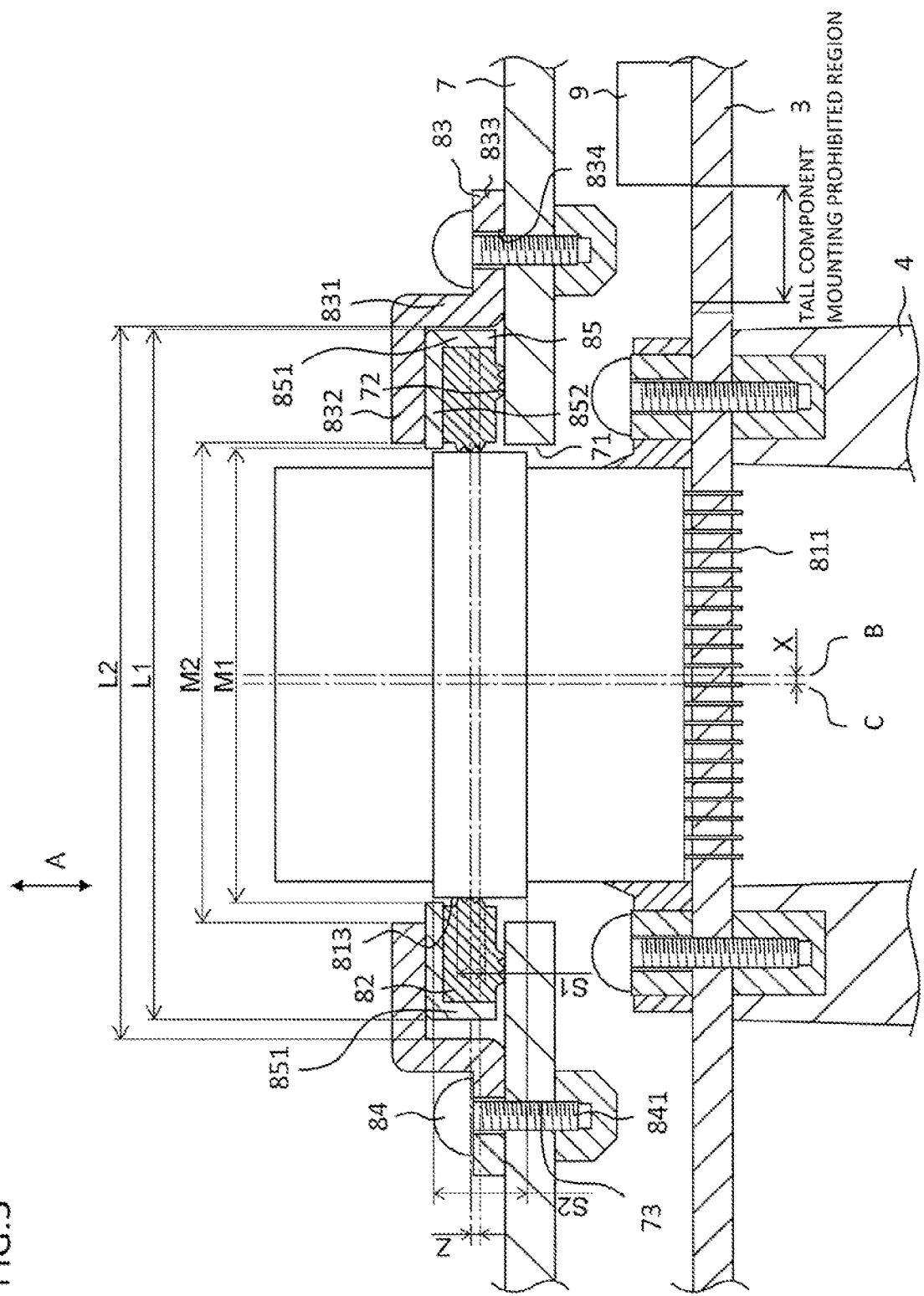
FIG. 5 is a longitudinal sectional view for illustrating a main part of a power conversion equipment including a waterproof connector according to a third embodiment of the present invention.

FIG. 5 is a longitudinal sectional view for illustrating a main part of a power conversion equipment including a waterproof connector according to a third embodiment of the present invention. The waterproof connector 8 further includes an outer seal holding member 85 configured to hold the annular seal member 82. The outer seal holding member 85 is formed in an annular shape. Movement of the annular seal member 82 in the direction along the housing sealing surface 72 with respect to the outer seal holding member 85 is restricted.

The outer seal holding member 85 includes a pair of outer holding member side-wall portions 851, which sandwich the annular seal member 82 in the direction along the housing sealing surface 72. Further, the outer seal holding member 85 includes a pair of outer holding member flat-plate portions 852. The pair of outer holding member flat-plate portions 852 are provided to the pair of outer holding member side-wall portions 851, respectively, and extend from the outer holding member side-wall portions 851 toward the connector main body 81.

The bracket 83 includes a pair of bracket side-wall portions 831, which sandwich the outer seal holding member 85 in the direction along the housing sealing surface 72. The bracket 83 includes a pair of bracket flat-plate portions 832. The pair of bracket flat-plate portions 832 are provided to the pair of bracket side-wall portions 831, respectively, and extend from the bracket side-wall portions 831 toward the connector main body 81. Further, the bracket 83 includes a pair of bracket fixing-plate portions 833. The pair of bracket fixing-plate portions 833 are provided to the pair of bracket side-wall portions 831, respectively, and extend from the bracket side-wall portions 831 in a direction away from the connector main body 81.

A dimension between the pair of outer holding member flat-plate portions 852 is represented by M1. A dimension between the pair of bracket flat-plate portions 832 is represented by M2. A positional shift amount between the center B of the connector main body 81 and the center C of the housing connector hole 71 in the direction along the housing sealing surface 72 is represented by X. A dimension of the outer seal holding member 85 in the direction along the housing sealing surface 72 is represented by L1. A dimension between the pair of bracket side-wall portions 831 is represented by L2. In this case, conditions M1<M2 and X<(L2−L1) are satisfied. In the conditions described above, the member (L2−L1)/2 expresses a gap between the outer seal holding member 85 and the bracket 83 in the direction along the housing sealing surface 72. Other configurations are the same as those of the first embodiment or the second embodiment.

As described above, with the waterproof connector 8 according to the third embodiment of the present invention, even when the positional shift amount X is large, the outer seal holding member 85 follows the positional shift between the center B of the connector main body 81 and the center C of the housing connector hole 71. As a result, a center of the annular seal member 82 can be matched with the center of the housing connector hole 71. Thus, a variation in squeeze of the annular seal member 82 in the circumferential direction can be suppressed. As a result, the waterproof performance of the waterproof connector 8 can be improved.

Further, even when the positional shift amount X is large, the outer seal holding member 85 follows the positional shift between the center B of the connector main body 81 and the center C of the housing connector hole 71. Thus, a gap between the connector main body sealing surface 813 and a portion of the outer seal holding member 85, which is opposed to the connector main body sealing surface 813, can be reduced without being influenced by the positional shift amount X. With the reduction of the gap, even when an internal pressure of the housing 7 becomes high with respect to a pressure of an outside air, protrusion of the annular seal member 82 externally from a gap between the connector main body 81 and the outer seal holding member 85 can be suppressed. As a result, the waterproof connector 8 can have high durability against repeated pressure changes.

Figure 6:
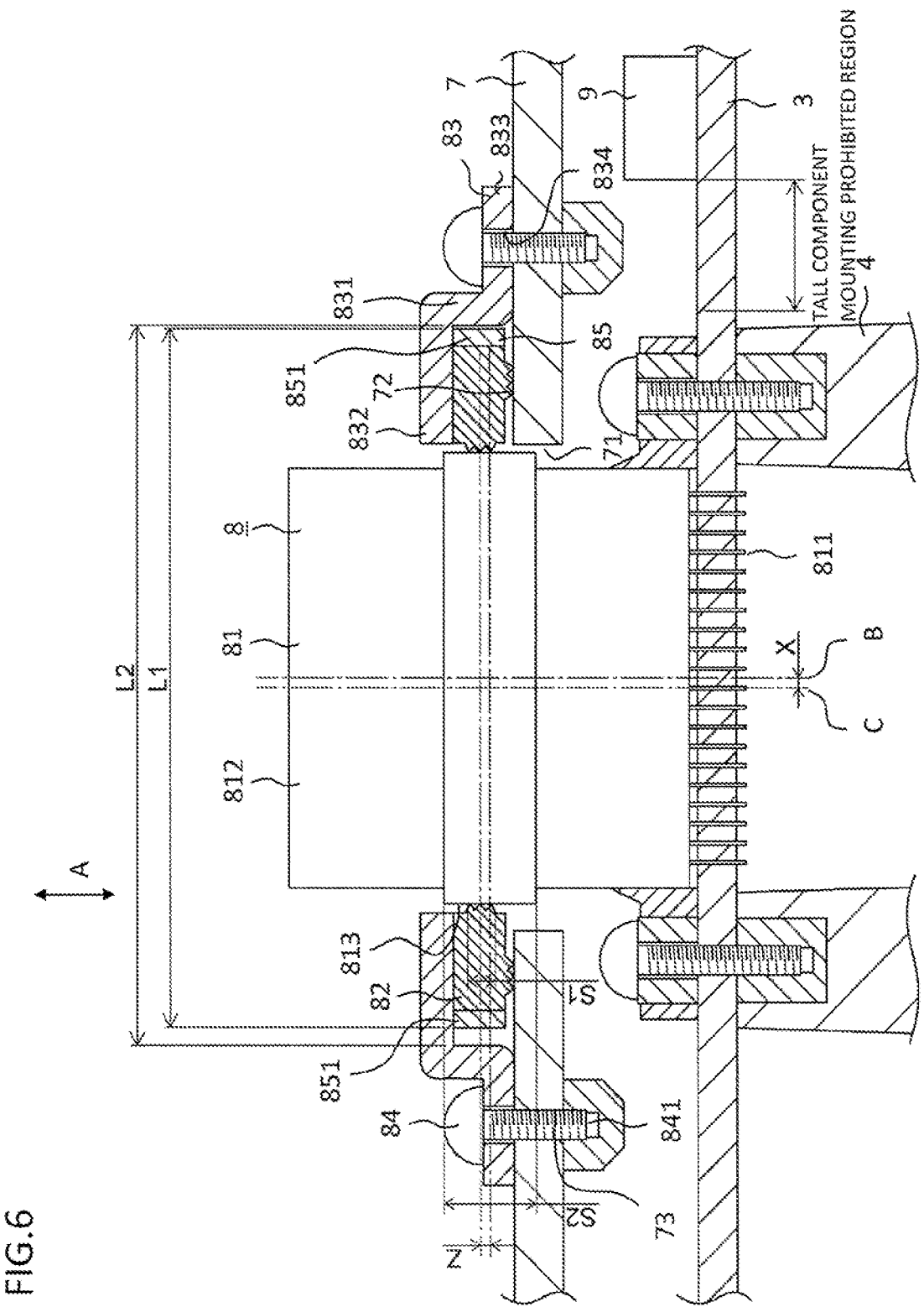
FIG. 6 is a longitudinal sectional view for illustrating a modification example of the waterproof connector according to the third embodiment.

FIG. 6 is a longitudinal sectional view for illustrating a modification example of the waterproof connector according to the third embodiment. In the third embodiment, there has been described the configuration in which the outer seal holding member 85 has the outer holding member side-wall portions 851 and the outer holding member flat-plate portions 852. Meanwhile, the outer seal holding member 85 may include only the outer holding member side-wall portions 851 without the outer holding member flat-plate portions 852. Even in this case, the condition $X<(L2-L1)/2$ is satisfied.

Fourth Embodiment

Figure 7:
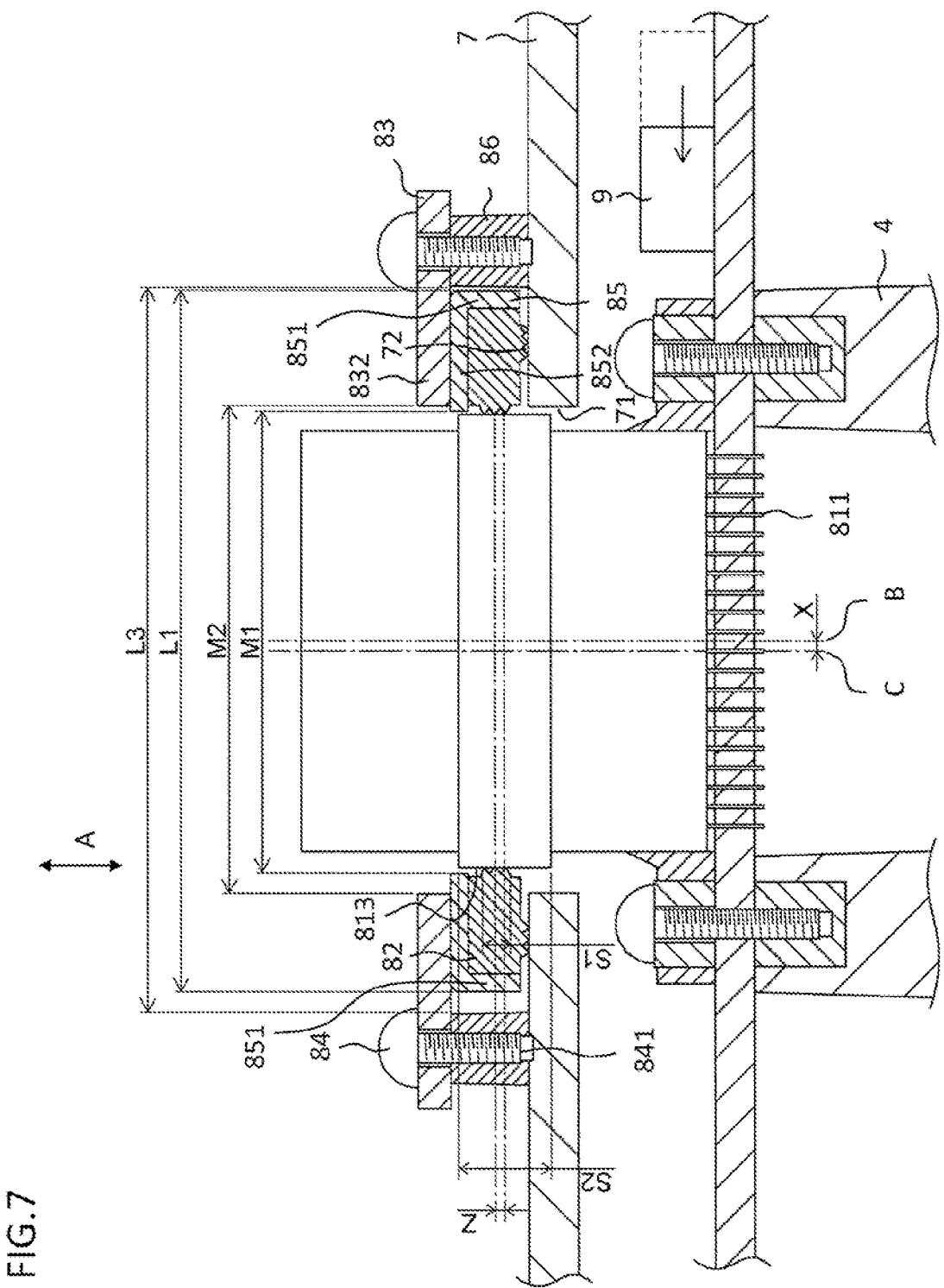
FIG. 7 is a longitudinal sectional view for illustrating a main part of a power conversion equipment including a waterproof connector according to a fourth embodiment of the present invention.

FIG. 7 is a longitudinal sectional view for illustrating a main part of a power conversion equipment including a waterproof connector according to a fourth embodiment of the present invention. The waterproof connector 8 includes the outer seal holding member 85 and a pair of bosses 86. The outer seal holding member 85 is configured to hold the annular seal member 82. The pair of bosses 86 are provided to the housing 7, and sandwich the outer seal holding member 85 in the direction along the housing sealing surface 72. Further, the waterproof connector 8 further includes a pair of the fasteners 84. The pair of fasteners 84 are provided to the pair of bosses 86, respectively, and are configured to fix the bracket 83 to the bosses 86. Movement of the annular seal member 82 in the direction along the housing sealing surface 72 with respect to the outer seal holding member 85 is restricted.

The outer seal holding member 85 includes a pair of outer holding member side-wall portions 851, which sandwich the annular seal member 82 in the direction along the housing sealing surface 72. Further, the outer seal holding member 85 includes a pair of outer holding member flat-plate portions 852. The pair of outer holding member flat-plate portions 852 are provided to the pair of outer holding member side-wall portions 851, respectively, and extend from the outer holding member side-wall portions 851 toward the connector main body 81.

The bracket 83 includes the pair of bracket flat-plate portions 832. The pair of bracket flat-plate portions 832 are provided to the pair of bosses 86, respectively, and extend from the bosses toward the connector main body.

The fasteners 84 are fitted into the bosses 86, respectively. Thus, the shaft portion 841 of each of the fasteners 84 does not protrude toward the circuit board 3 side with respect to the housing 7. As a result, an insulation distance between a component 9 to be mounted on the circuit board 3 and each of the fasteners 84 can easily be secured. As a result, ease of layout for the component 9 to be mounted on the circuit board 3 is improved. In this manner, reduction in size and downsizing of the housing 7 can be achieved. As a result, cost reduction of the housing 7 can be achieved. The plurality of bosses 86 are arranged so as to sandwich the connector main body 81, the annular seal member 82, and the outer seal holding member 85 therebetween in the direction along the housing sealing surface 72.

A dimension between the pair of outer holding member flat-plate portions 852 is represented by M1. A dimension between the pair of bracket flat-plate portions 832 is represented by M2. A positional shift amount between the center B of the connector main body 81 and the center C of the housing connector hole 71 in the direction along the housing sealing surface 72 is represented by X. A dimension of the outer seal holding member 85 in the direction along the housing sealing surface 72 is represented by L1. A dimension between the pair of bosses 86 is represented by L3. In this case, conditions $M1<M2$ and $X<(L3-L1)/2$ are satisfied. In the conditions described above, the side $(L3-L1)/2$ expresses a gap between the outer seal holding member 85 and the bosses 86 in the direction along the housing sealing surface 72. Other configurations are the same as those of the first embodiment to the third embodiment.

As described above, with the waterproof connector 8 according to the fourth embodiment, the fasteners 84 do not protrude toward an inside of the housing 7. Thus, the insulation distance between the circuit board 3 and the component 9 to be mounted on the circuit board 3, and the fasteners 84 can be secured. As a result, the ease of layout for the component 9 to be mounted on the circuit board 3 can be improved. In this manner, the reduction in size and the downsizing of the housing 7 can be achieved. As a result, the cost reduction of the housing 7 can be achieved.

Figure 8:
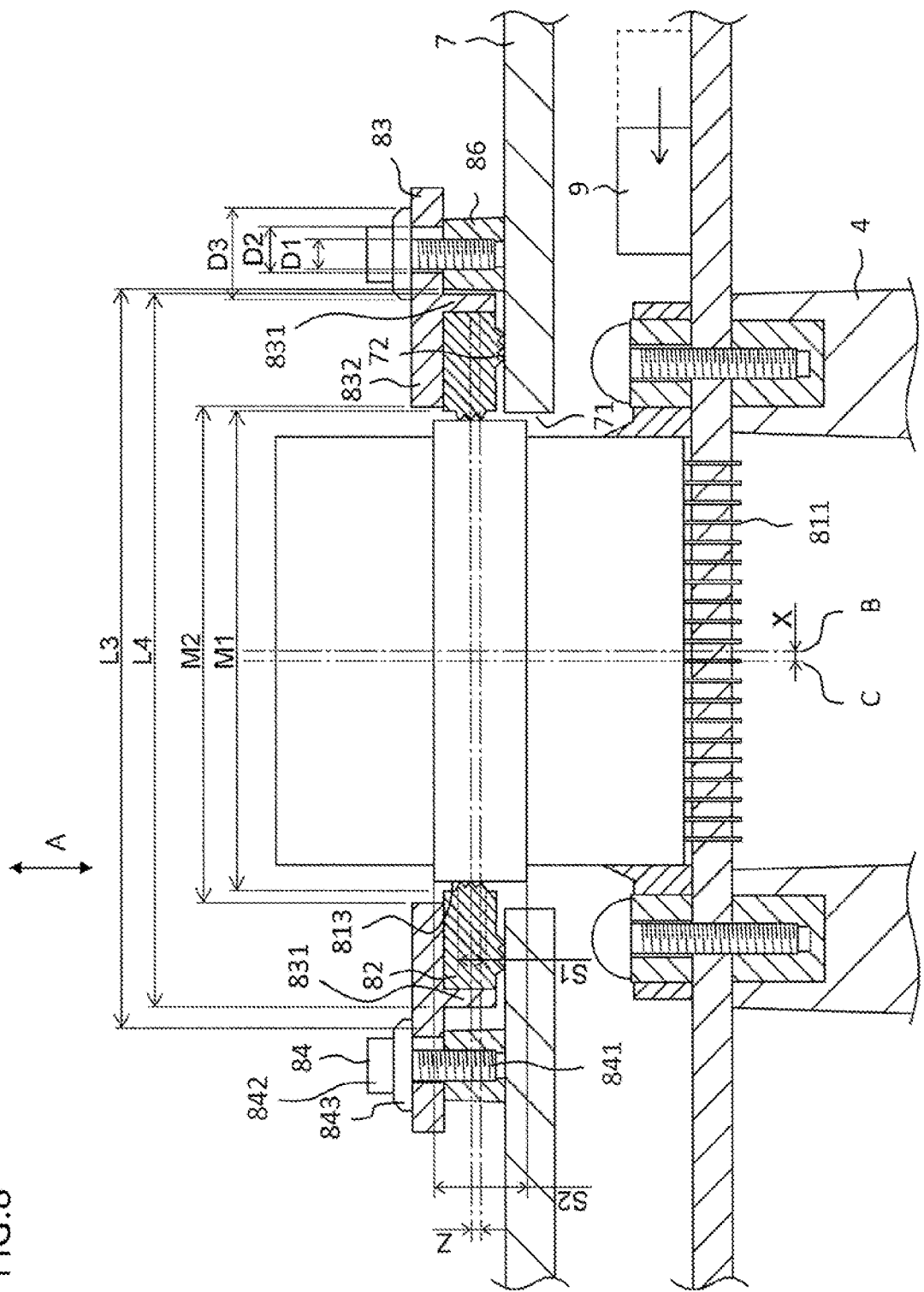
FIG. 8 is a longitudinal sectional view for illustrating a modification example of the waterproof connector according to the fourth embodiment of the present invention.

FIG. 8 is a longitudinal sectional view for illustrating a modification example of the waterproof connector according to the fourth embodiment. In the fourth embodiment, there has been described the configuration in which the waterproof connector 8 includes the outer seal holding member 85. Meanwhile, the waterproof connector 8 is not required to include the outer seal holding member 85. In this case, the bracket 83 includes the pair of bracket side-wall portions 831, which sandwich the annular seal member 82 in the direction along the housing sealing surface 72. The pair of bosses 86 sandwich the annular seal member 82 through intermediation of the pair of bracket side-wall portions 831 in the direction along the housing sealing surface 72.

Figure 9:
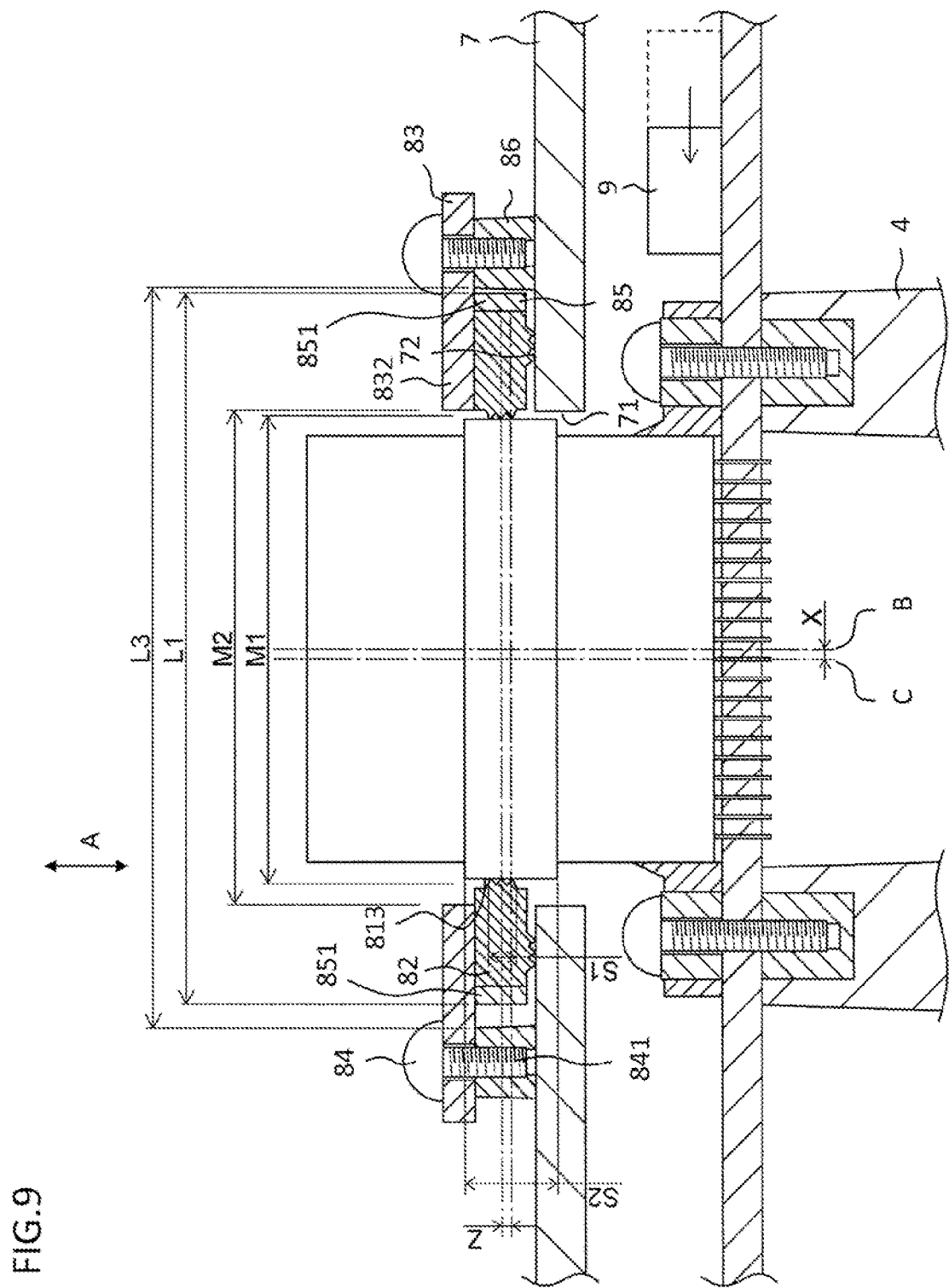
FIG. 9 is a longitudinal sectional view for illustrating a modification example of the waterproof connector according to the fourth embodiment of the present invention.

FIG. 9 is a longitudinal sectional view for illustrating a modification example of the waterproof connector according to the fourth embodiment. In the fourth embodiment, there has been described the configuration in which the outer seal holding member 85 has the outer holding member side-wall portions 851 and the outer holding member flat-plate portions 852. Meanwhile, the outer seal holding member 85 may include only the outer holding member side-wall portions 851 without the outer holding member flat-plate portions 852.

Figure 10:
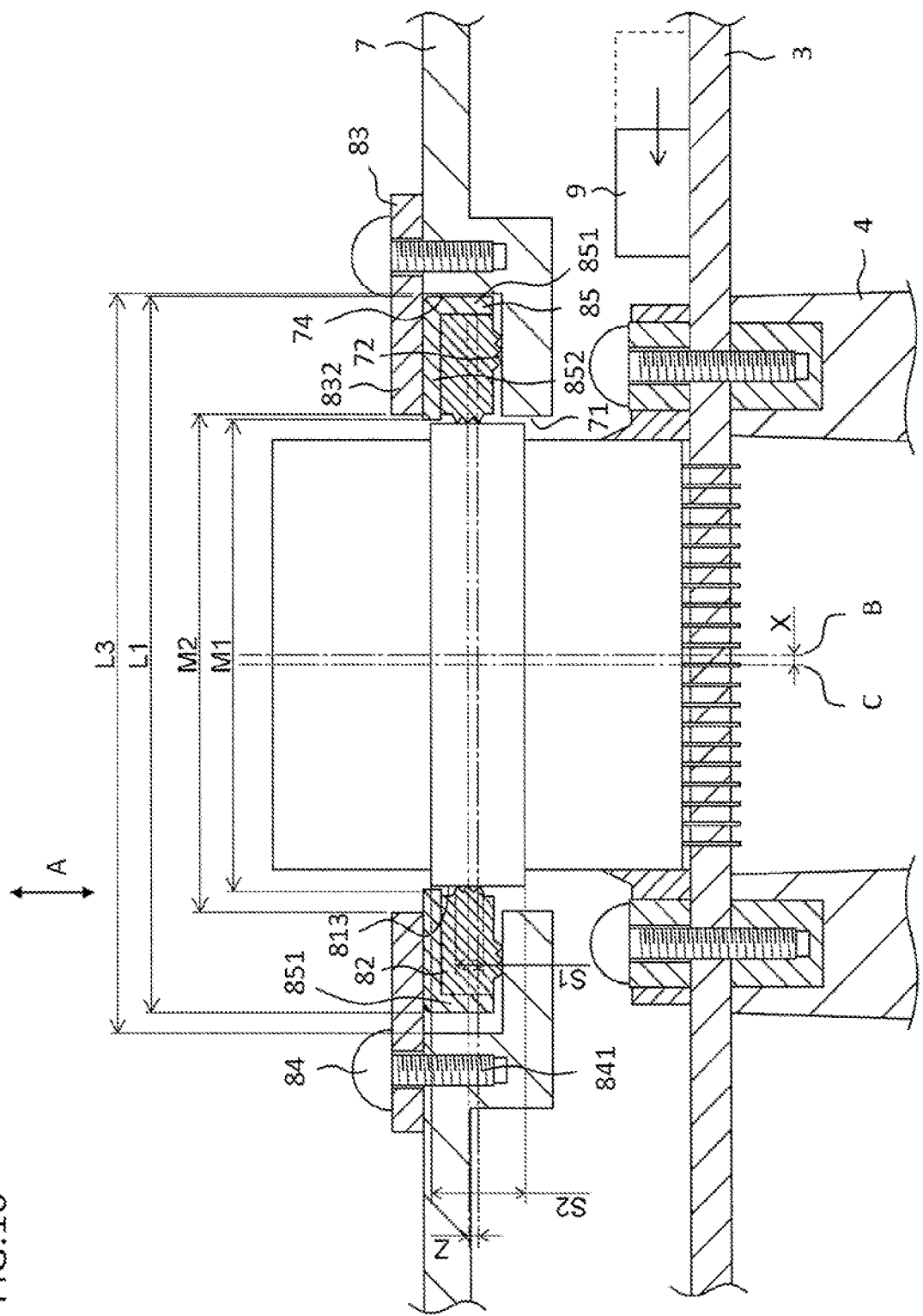
FIG. 10 is a longitudinal sectional view for illustrating a modification example of the waterproof connector according to the fourth embodiment of the present invention.

FIG. 10 is a longitudinal sectional view for illustrating a modification example of the waterproof connector according to the fourth embodiment. In the fourth embodiment, there has been described the configuration in which the waterproof connector 8 includes the bosses 86. Meanwhile, the waterproof connector 8 is not required to include the bosses 86. In this case, an annular seal member accommodation groove 74 in which the annular seal member 82 is to be accommodated may be formed at a peripheral edge of the housing connector hole 71 formed in the housing 7. The outer seal holding member 85 may be accommodated together with the annular seal member 82 in the annular seal member accommodation groove 74.

Fifth Embodiment

Figure 11:
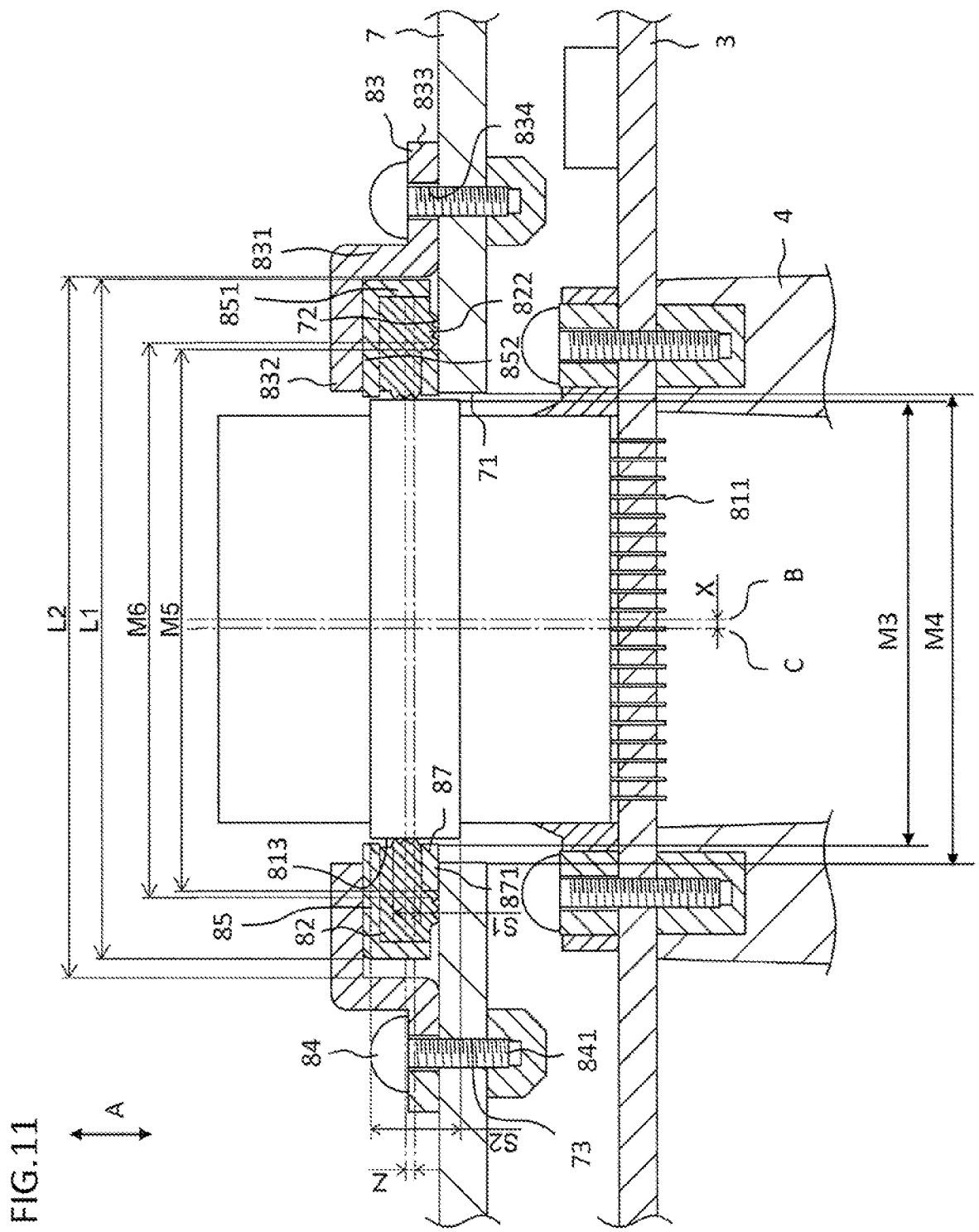
FIG. 11 is a longitudinal sectional view for illustrating a main part of a power conversion equipment including a waterproof connector according to a fifth embodiment of the present invention.

FIG. 11 is a longitudinal sectional view for illustrating a main part of a power conversion equipment including a waterproof connector according to a fifth embodiment of the present invention. The waterproof connector 8 further includes an inner seal holding member 87 provided between the housing 7 and the annular seal member 82. Movement of the annular seal member 82 in the direction along the housing sealing surface 72 with respect to the outer seal holding member 85 is restricted.

The outer seal holding member 85 includes a pair of outer holding member side-wall portions 851, which sandwich the annular seal member 82 in the direction along the housing sealing surface 72. Further, the outer seal holding member 85 includes a pair of outer holding member flat-plate portions 852. The pair of outer holding member flat-plate portions 852 are provided to the pair of outer holding member side-wall portions 851, respectively, and extend from the outer holding member side-wall portions 851 toward the connector main body 81.

The bracket 83 includes a pair of bracket side-wall portions 831, which sandwich the outer seal holding member 85 in the direction along the housing sealing surface 72. The bracket 83 includes a pair of bracket flat-plate portions 832. The pair of bracket flat-plate portions 832 are provided to the pair of bracket side-wall portions 831, respectively, and extend from the bracket side-wall portions 831 toward the connector main body 81. Further, the bracket 83 includes a pair of bracket fixing-plate portions 833. The pair of bracket fixing-plate portions 833 are provided to the pair of bracket side-wall portions 831, respectively, and extend from the bracket side-wall portions 831 in a direction away from the connector main body 81.

The annular seal member 82 has a pair of housing sealing surface contact portions 822. The pair of housing sealing surface contact portions 822 sandwich the inner seal holding member 87 in the direction along the housing sealing surface 72, and are each held in contact with the housing sealing surface 72.

The inner seal holding member 87 includes a pair of inner holding member flat-plate portions 871, which sandwich the connector main body 81 in the direction along the housing sealing surface 72.

A dimension between the pair of inner holding member flat-plate portions 871 is represented by M3. A dimension of the housing connector hole 71 is represented by M4. A dimension of the inner seal holding member 87 in the direction along the housing sealing surface 72 is represented by M5. A dimension between the pair of housing sealing surface contact portions 822 is represented by M6. In this case, a condition M3<M4<M5<M6 is satisfied. Other configurations are the same as those of any one of the first to fourth embodiments.

As described above, with the waterproof connector 8 according to the fifth embodiment of the present invention, the inner seal holding member 87 follows a positional shift between the center B of the connector main body 81 and the center C of the housing connector hole 71 in the direction along the housing sealing surface 72. Further, a gap between the housing sealing surface 72 and a portion of the inner seal holding member 87, which is opposed to the housing sealing surface 72, can be reduced without being influenced by the positional shift amount X. With the reduction of the gap, even when an internal pressure of the housing 7 becomes low with respect to a pressure of an outside air, protrusion of the annular seal member 82 externally from a gap between the connector main body 81 and the housing 7 can be suppressed. As a result, the waterproof connector 8 can have high durability against repeated pressure changes.

Sixth Embodiment

Figure 12:
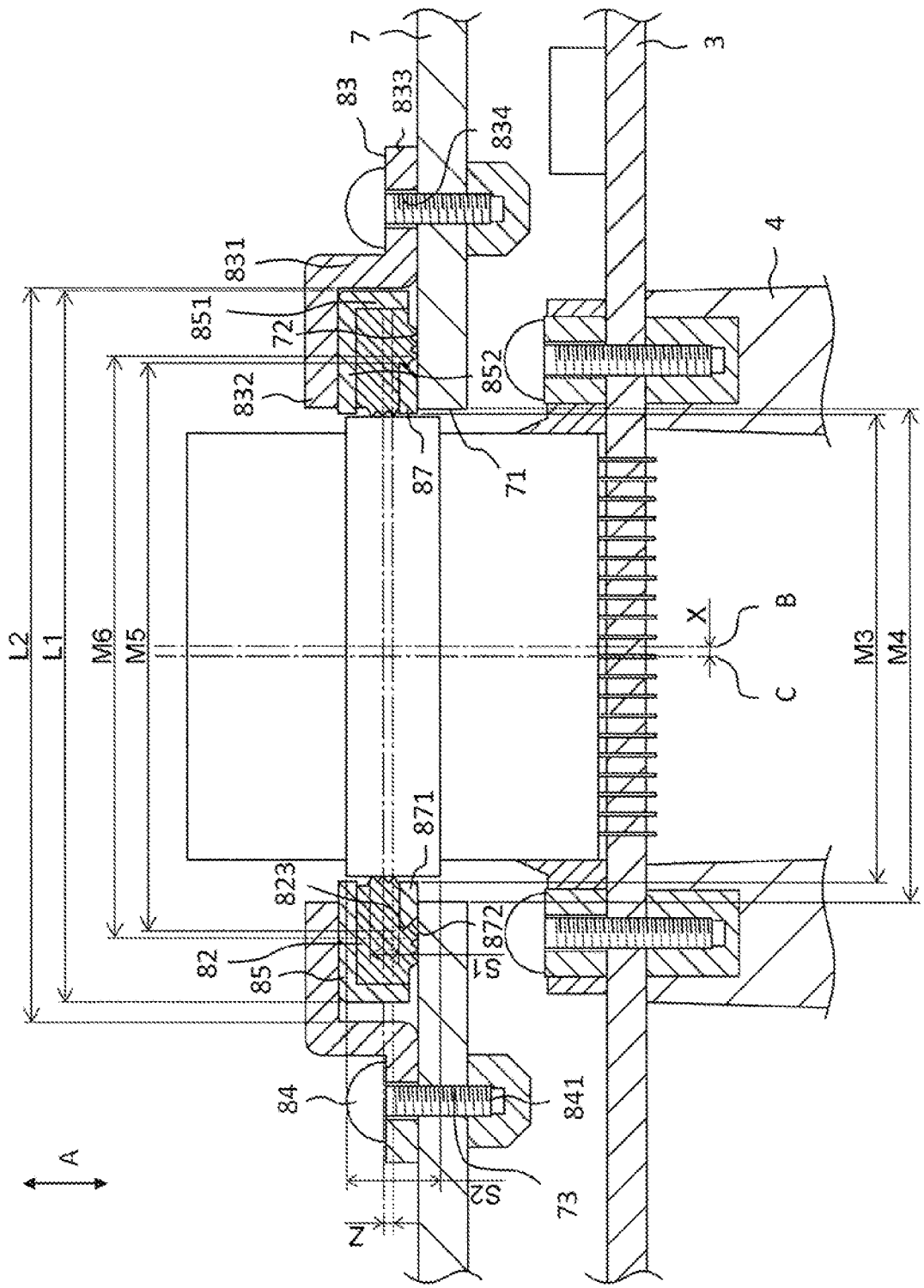
FIG. 12 is a longitudinal sectional view for illustrating a main part of a power conversion equipment including a waterproof connector according to a sixth embodiment of the present invention.

FIG. 12 is a longitudinal sectional view for illustrating a main part of a power conversion equipment including a waterproof connector according to a sixth embodiment of the present invention. The pair of inner holding member flat-plate portions 871 have a pair of tapered surfaces 872, respectively. The pair of tapered surfaces 872 are formed on a side opposite to the connector main body 81 so as to approach the connector main body 81 in a direction toward the housing 7. The annular seal member 82 has a groove 823 into which the pair of tapered surfaces 872 are to be inserted. With the insertion of the tapered surfaces 872 into the groove 823, the inner seal holding member 87 is mounted inside the annular seal member 82. Other configurations are the same as those of the fifth embodiment.

As described above, with the waterproof connector 8 according to the sixth embodiment of the present invention, the tapered surfaces 872 of the inner seal holding member 87 are inserted into the groove 823 of the annular seal member 82. With the insertion, the inner seal holding member 87 is mounted into the annular seal member 82. As a result, after the outer seal holding member 85, the annular seal member 82, and the inner seal holding member 87 are assembled, the inner seal holding member 87 can be prevented from falling off from the annular seal member 82 when the above-mentioned members are assembled to the housing 7. As a result, ease of assembly of the waterproof connector 8 can be improved.

Seventh Embodiment

Figure 13:
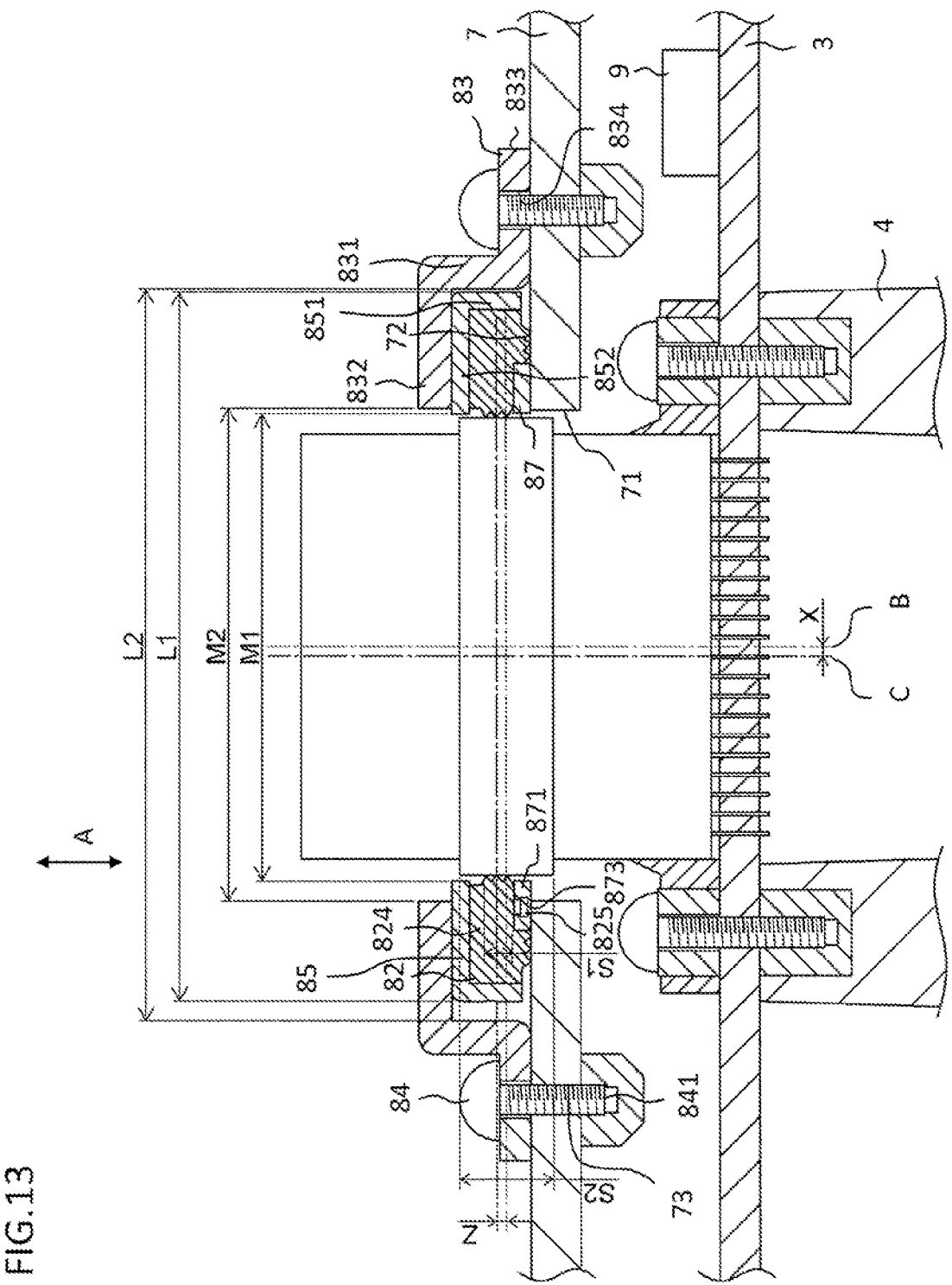
FIG. 13 is a longitudinal sectional view for illustrating a main part of a power conversion equipment including a waterproof connector according to a seventh embodiment of the present invention.

FIG. 13 is a longitudinal sectional view for illustrating a main part of a power conversion equipment including a waterproof connector according to a seventh embodiment of the present invention. Each of the pair of inner holding member flat-plate portions 871 has a through hole 873 penetrating in a thickness direction of the inner holding member flat-plate portions 871. The annular seal member 82 includes a seal member main body 824 and protruding portions 825. The protruding portions 825 are formed integrally with the seal member main body 824, and are to be fitted into the through holes 873. With the insertion of the protruding portions 825 into the through holes 873, the inner seal holding member 87 is mounted into the annular seal member 82. Other configurations are the same as those of the fifth embodiment or the sixth embodiment.

Figure 14:
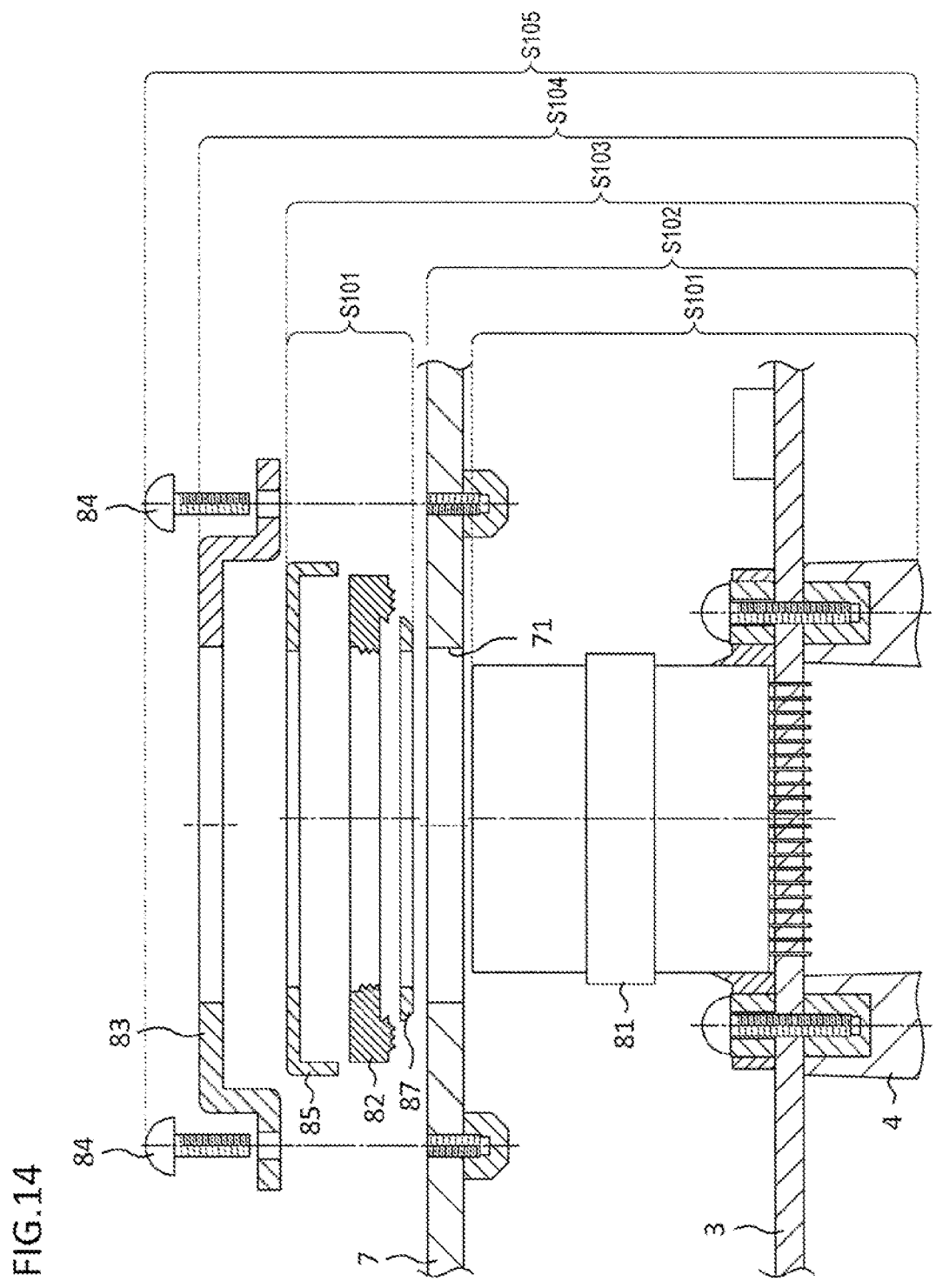
FIG. 14 is a view for illustrating a state in which the waterproof connector 8 of FIG. 13 is disassembled.
Figure 15:
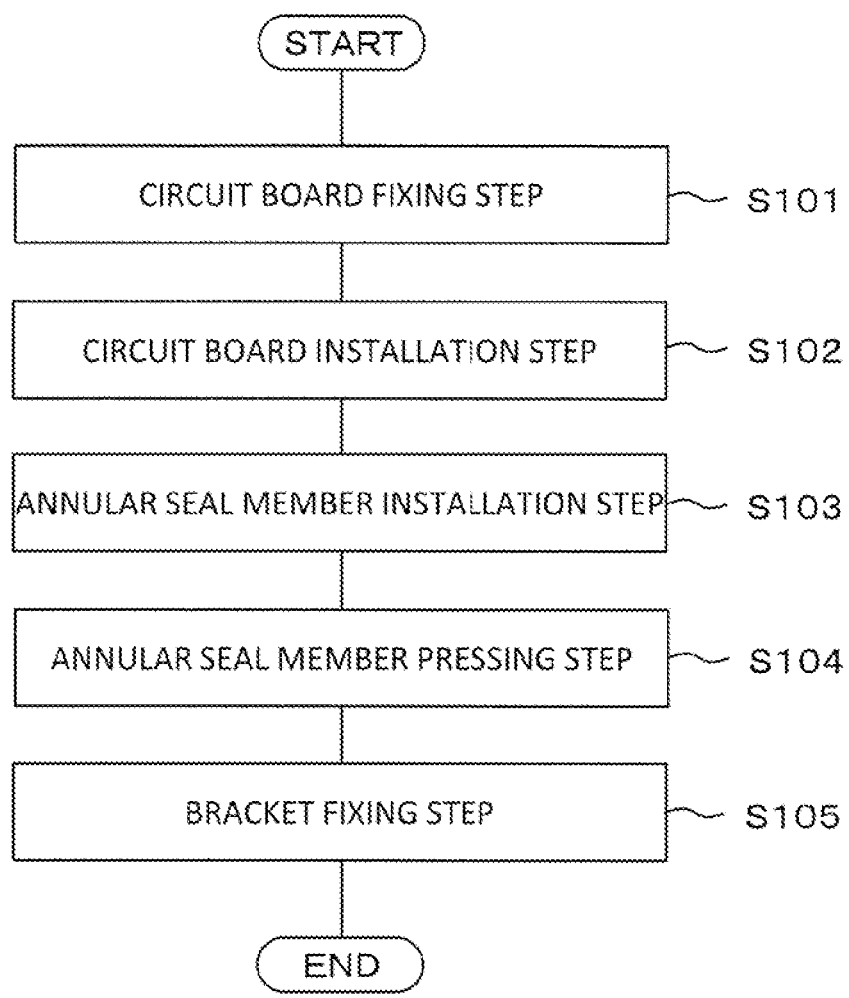
FIG. 15 is a flowchart for illustrating an assembly procedure of the waterproof connector 8 according to the seventh embodiment of the present invention.

Next, an assembly procedure of the waterproof connector 8 is described. FIG. 14 is a view for illustrating a state in which the waterproof connector 8 of FIG. 13 is disassembled, and FIG. 15 is a flowchart for illustrating an assembly procedure of the waterproof connector 8 according to the seventh embodiment of the present invention. First, in Step S101, a circuit board fixing step is carried out. In the circuit board fixing step, the circuit board 3, onto which the connector main body 81 is mounted, is fixed onto the support case 4. Further, in this step, the outer seal holding member 85, the annular seal member 82, and the inner seal holding member 87 are assembled.

After that, in Step S102, a circuit board installation step is carried out. In the circuit board installation step, the circuit board 3 is installed inside the housing 7 so that the connector main body 81 is inserted into the housing connector hole 71.

After that, in Step S103, an annular seal member installation step is carried out. In the annular seal member installation step, the outer seal holding member 85, the annular seal member 82, and the inner seal holding member 87 are installed on the housing 7 so that the annular seal member 82 is brought into contact with each of the connector main body sealing surface 813 and the housing sealing surface 72.

After that, in Step S104, an annular seal member pressing step is carried out. In the annular seal member pressing step, the bracket 83 is installed on the housing 7 so as to press the annular seal member 82 against the housing 7.

After that, in Step S105, a bracket fixing step is carried out. In the bracket fixing step, the bracket 83 is fixed to the housing 7 with use of the fasteners 84. Through the steps described above, the assembly of the waterproof connector 8 is terminated.

As described above, with the waterproof connector 8 according to the seventh embodiment of the present invention, the protruding portions 825 of the annular seal member 82 are inserted into the through hole 873 of the inner seal holding member 87. With the insertion, the inner seal holding member 87 is mounted into the annular seal member 82. As a result, after the outer seal holding member 85, the annular seal member 82, and the inner seal holding member 87 are assembled, the inner seal holding member 87 can be prevented from falling off from the annular seal member 82 when the above-mentioned members are assembled to the housing 7. As a result, ease of assembly of the waterproof connector 8 can be improved.

Further, with the method of assembling the waterproof connector 8 according to the seventh embodiment, the annular seal member 82 is held in contact with each of the connector main body sealing surface 813 and the housing sealing surface 72 to close the gap between the housing 7 and the connector main body 81. In this manner, only the connector main body 81 is inserted into the housing connector hole 71. Thus, a dimension of the housing connector hole 71 can be reduced. As a result, a circumferential length of the annular seal member 82 can be reduced. With the reduction of the circumferential length, the waterproof performance of the waterproof connector 8 can be improved.

Eighth Embodiment

Figure 16:
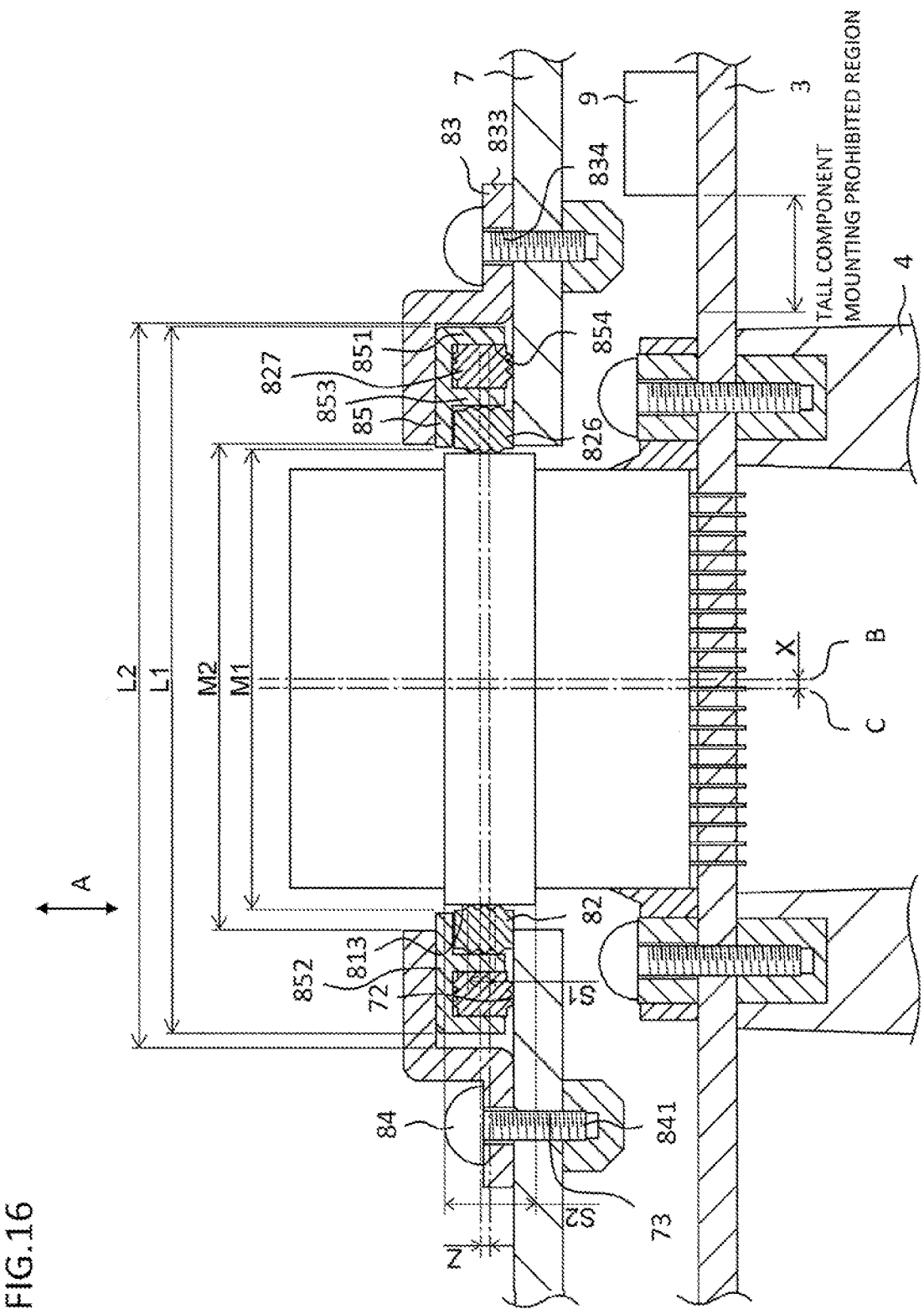
FIG. 16 is a longitudinal sectional view for illustrating a main part of a power conversion equipment including a waterproof connector 8 according to an eighth embodiment of the present invention.

FIG. 16 is a longitudinal sectional view for illustrating a main part of a power conversion equipment including a waterproof connector 8 according to an eighth embodiment of the present invention. The annular seal member 82 includes a first seal member 826 to be held in contact with the connector main body sealing surface 813 and a second seal member 827 to be held in contact with the housing sealing surface 72. The first seal member 826 and the second seal member 827 are separated from each other. Each of the first seal member 826 and the second seal member 827 is formed in an annular shape.

The outer seal holding member 85 includes a pair of seal member holding side-wall portions 853, which sandwich the first seal member 826 in the direction along the housing sealing surface 72. The outer seal holding member 85 has a second seal member accommodation groove 854 into which the second seal member 827 is to be accommodated. The second seal member accommodation groove 854 is formed by the first seal member holding side-wall portions 853, the outer holding member side-wall portions 851, and the outer holding member flat-plate portions 852. Other configurations are the same as those of any one of the first to seventh embodiments.

As described above, with the waterproof connector 8 according to the eighth embodiment of the present invention, the annual seal member 82 includes the first seal member 826 to be held in contact with the connector main body sealing surface 813 and the second seal member 827 to be held in contact with the housing sealing surface 72. Further, the first seal member 826 and the second seal member 827 are separated from each other. As a result, the first seal member 826 and the second seal member 827 can be arranged so that compression allowance variations thereof do not influence each other.

Further, the outer seal holding member 85 includes the pair of first seal member holding side-wall portions 853, which sandwich the first seal member 826 in the direction along the housing sealing surface 72. The outer seal holding member 85 has the second seal member accommodation groove 854 in which the second seal member 827 is to be accommodated. With the configuration described above, the first seal member 826 and the second seal member 827 can be separately mounted to the outer seal holding member 85.

Figure 17:
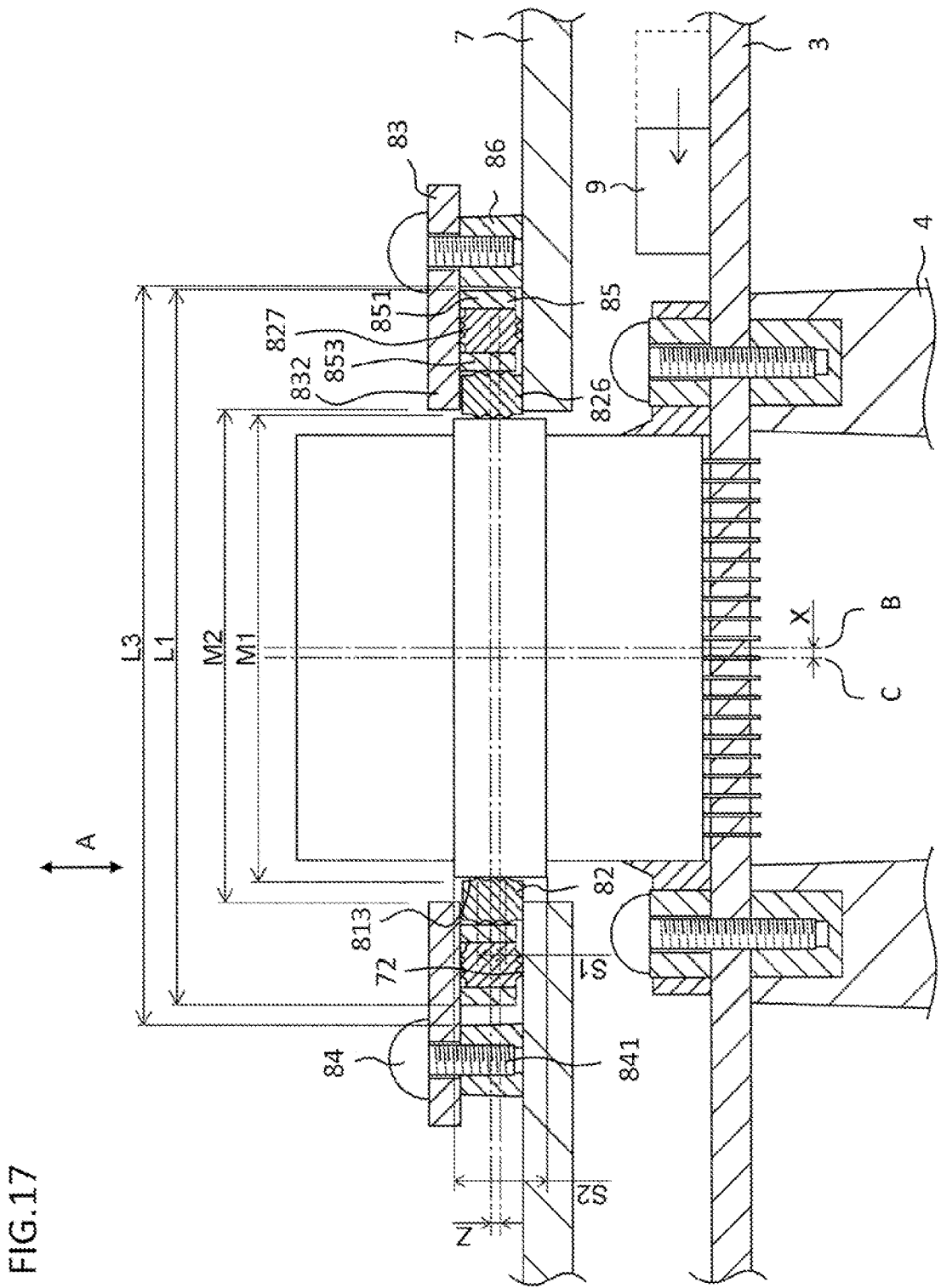
FIG. 17 is a longitudinal sectional view for illustrating a modification example of the waterproof connector according to the eighth embodiment of the present invention.

FIG. 17 is a longitudinal sectional view for illustrating a modification example of the waterproof connector according to the eighth embodiment. In the eighth embodiment, there has been described the configuration in which the outer seal holding member 85 has the outer holding member flat-plate portions 852. Meanwhile, the outer seal holding member 85 is not required to have the outer holding member flat-plate portions 852. In this case, the outer seal holding member 85 includes the first seal member holding side-wall portions 853 and the outer holding member side-wall portions 851. In this case, the waterproof connector 8 may include the bosses 86.

Figure 18:
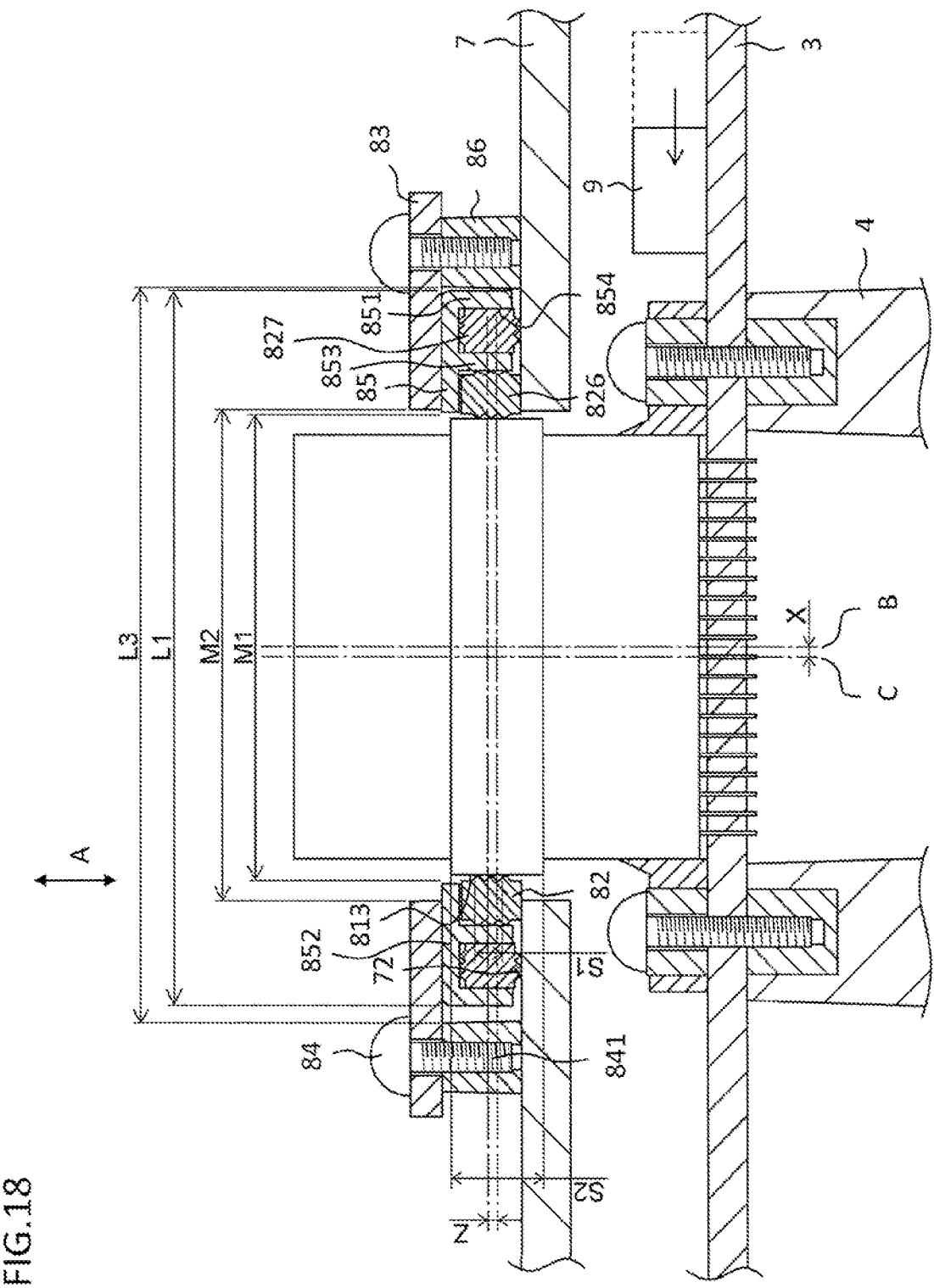
FIG. 18 is a longitudinal sectional view for illustrating a modification example of the waterproof connector according to the eighth embodiment of the present invention.

FIG. 18 is a longitudinal sectional view for illustrating a modification example of the waterproof connector according to the eighth embodiment. In the eighth embodiment, there has been described the configuration in which the waterproof connector 8 does not include the bosses 86. Meanwhile, the waterproof connector 8 may include the bosses 86.

Figure 19:
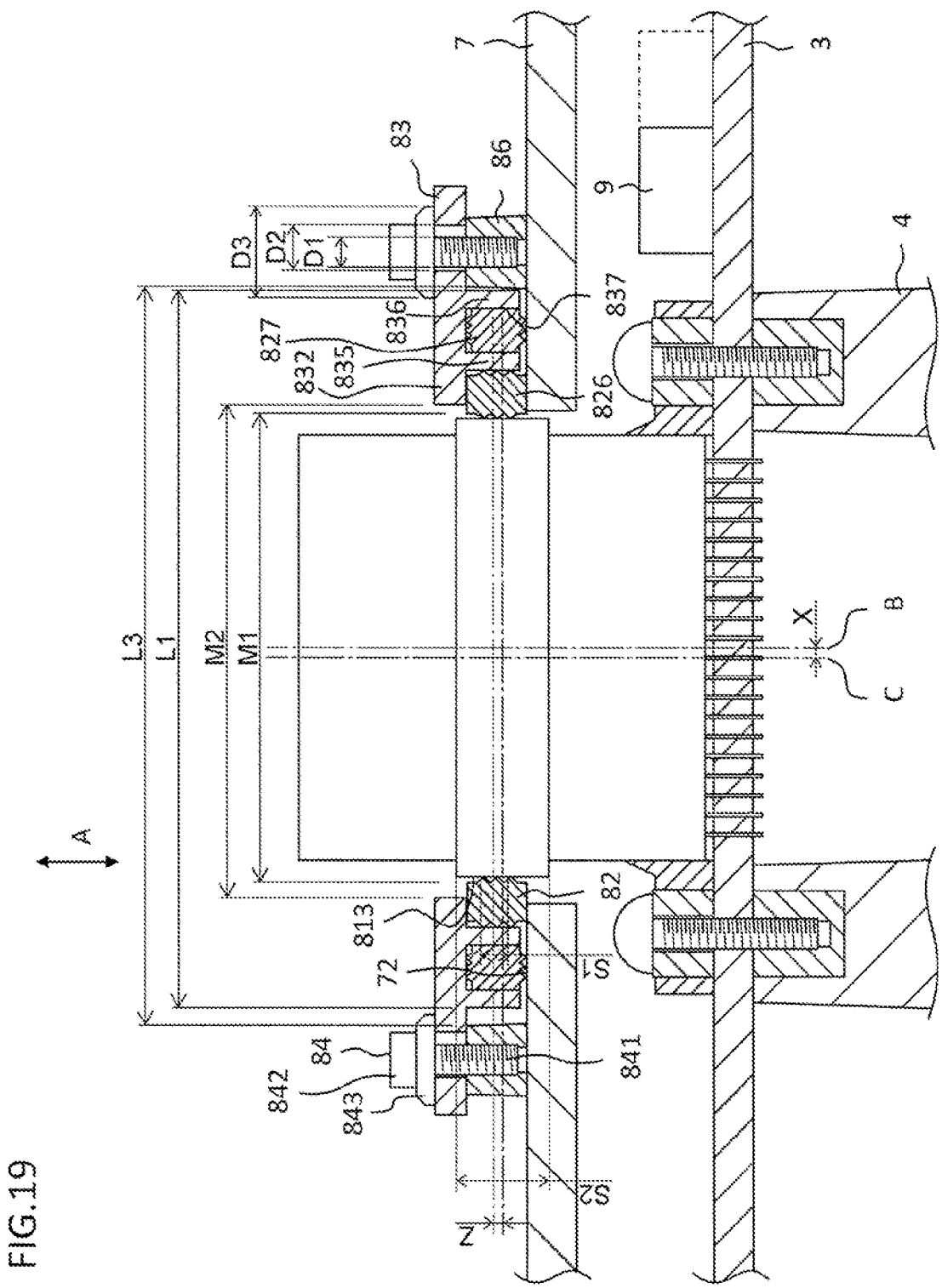
FIG. 19 is a longitudinal sectional view for illustrating a modification example of the waterproof connector according to the eighth embodiment of the present invention.

FIG. 19 is a longitudinal sectional view for illustrating a modification example of the waterproof connector according to the eighth embodiment. In the eighth embodiment, there has been described the configuration in which the waterproof connector 8 includes the outer seal holding member 85. Meanwhile, the waterproof connector 8 is not required to include the outer seal holding member 85. In this case, the bracket 83 includes a pair of bracket first side-wall portions 835 and a pair of bracket second side-wall portions 836. The pair of bracket first side-wall portions 835 sandwich the first seal member 826 in the direction along the housing sealing surface 72. The pair of bracket second side-wall portions 836 sandwich the second seal member 827 in the direction along the housing sealing surface 72. A second seal member accommodation groove 837 is formed by the bracket first side-wall portions 835, the bracket second side-wall portions 836, and the bracket flat-plate portions 832. The second seal member 827 is accommodated in the second seal member accommodation groove 837.

Figure 20:
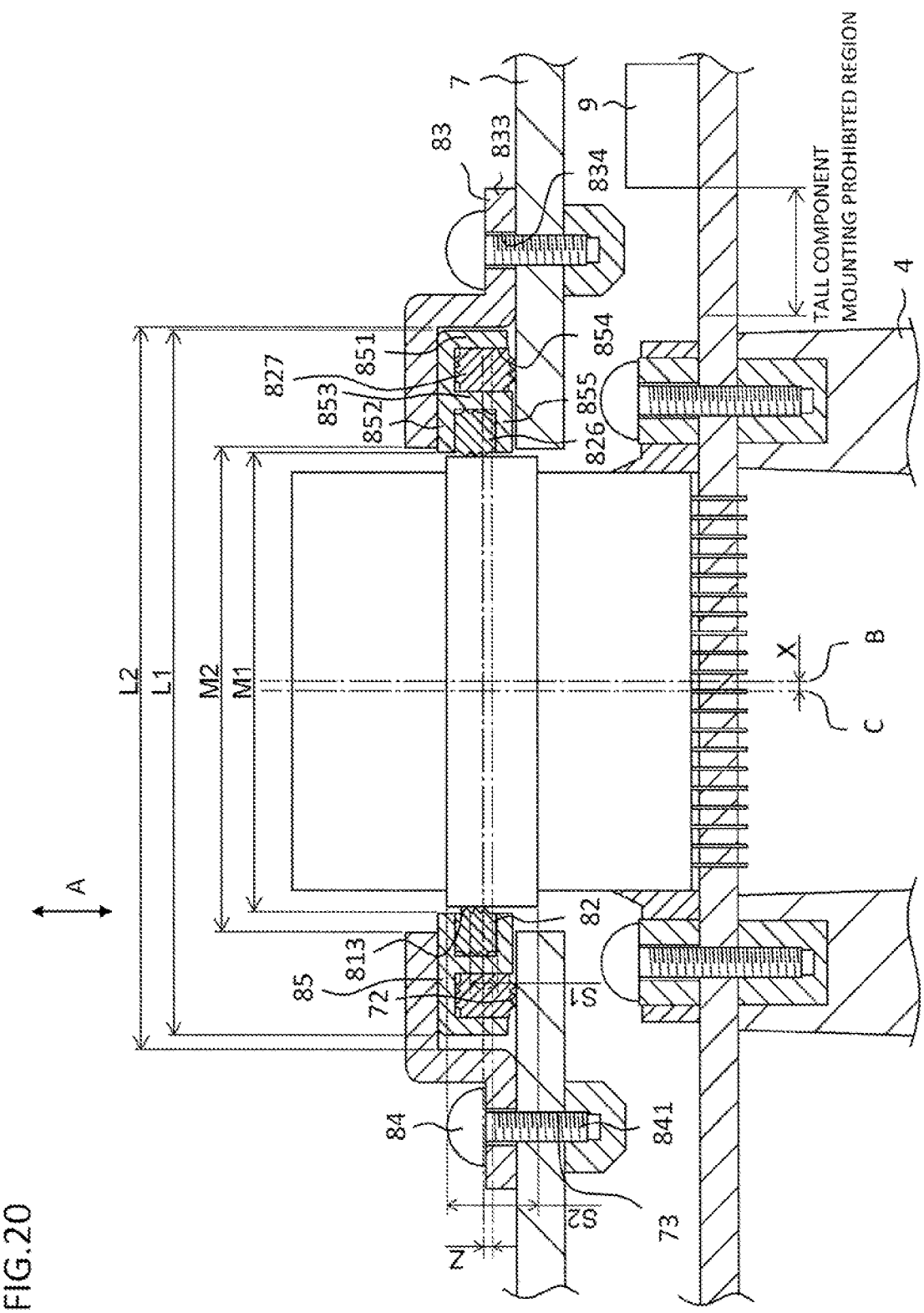
FIG. 20 is a longitudinal sectional view for illustrating a modification example of the waterproof connector according to the eighth embodiment of the present invention.

FIG. 20 is a longitudinal sectional view for illustrating a modification example of the waterproof connector according to the eighth embodiment. In the eighth embodiment, there has been described the configuration in which the outer seal holding member 85 has the first seal member holding side-wall portions 853. Meanwhile, the outer seal holding member 85 may further have first seal member holding flat-plate portions 855, which are provided to the first seal member holding side-wall portions 853 and are arranged between the first seal member 826 and the housing sealing surface 72.

Figure 21:
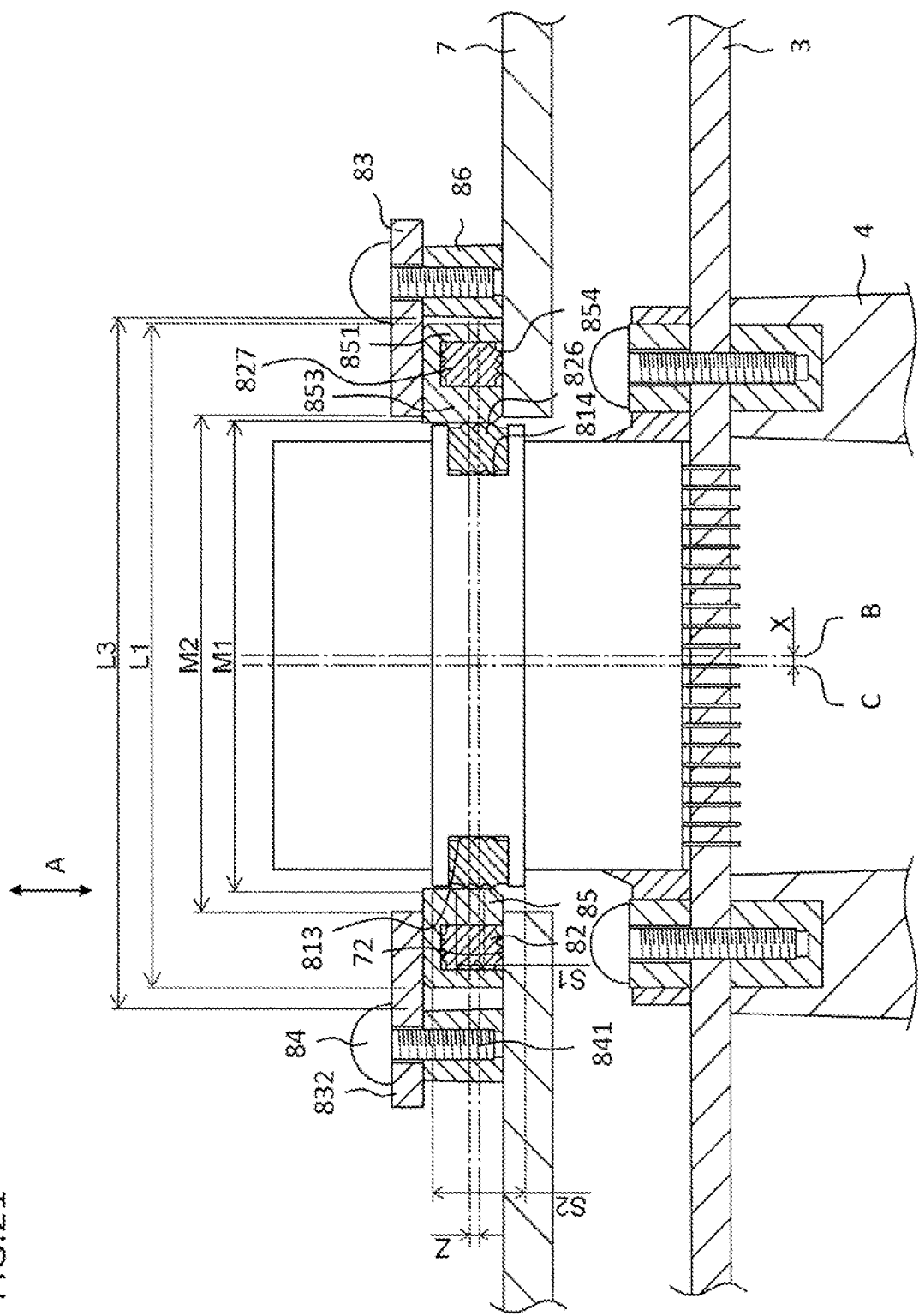
FIG. 21 is a longitudinal sectional view for illustrating a modification example of the waterproof connector according to the eighth embodiment of the present invention.

FIG. 21 is a longitudinal sectional view for illustrating a modification example of the waterproof connector according to the eighth embodiment. In the eighth embodiment, there has been described the configuration in which the first seal member 826 is held inside the outer seal holding member 85.

Meanwhile, the first seal member 826 may be held in the connector main body 81. In this case, the connector main body 81 has a first seal member accommodation groove 814 into which the first seal member 826 is to be accommodated.

REFERENCE SIGNS LIST

1 water-cooling heat sink, 2 power semiconductor element, 3 circuit board, 4 support case, 5 smoothing capacitor, 6 screw, 7 housing, 8 waterproof connector, 9 component, 11 surface, 21 element main body, 22 relay terminal, 31 mounting surface, 41 input terminal, 42 output terminal, 43 bus bar, 51 capacitor main body, 52 bus bar, 71 housing connector hole, 72 housing sealing surface, 73 screw hole, 74 annular seal member accommodation groove, 81 connector main body, 82 annular seal member, 83 bracket, 84 fastener, 85 outer seal holding member, 86 boss, 87 inner seal holding member, 811 terminal, 812 housing, 813 connector main body sealing surface, 814 first seal member accommodation groove, 821 outer surface, 822 housing sealing surface contact portion, 823 groove, 824 seal member main body, 825 protruding portion, 826 first seal member, 827 second seal member, 831 bracket side-wall portion, 832 bracket flat-plate portion, 833 bracket fixing-plate portion, 834 bracket fastener hole, 835 bracket first side-wall portion, 836 bracket second side-wall portion, 837 second seal member accommodation groove, 841 shaft portion, 842 head portion, 843 flange portion, 844 washer, 845 through hole, 851 outer holding member side-wall portion, 852 outer holding member flat-plate portion, 853 first seal member holding side-wall portion, 854 second seal member accommodation groove, 855 first seal member holding flat-plate portion, 871 inner holding member flat-plate portion, 872 tapered surface, 873 through hole

The invention claimed is:

1. A waterproof connector, comprising:
   a connector main body, which is mounted on a circuit board provided inside a housing, and is to be inserted into a housing connector hole formed in the housing;
   an annular seal member, which is provided outside the housing, and surrounds the connector main body;
   a bracket, which is provided to the housing, and is configured to press the annular seal member against the housing,
   wherein the annular seal member is held in contact with a connector main body sealing surface of the connector main body and a housing sealing surface of the housing to close a gap between the housing and the connector main body, and
   wherein the bracket includes:
      a pair of bracket side-wall portions which extend at outer sides of the annular seal member, respectively, and sandwich the outer sides of the annular seal member in a direction toward the connector main body sealing surface along the housing sealing surface,
      a pair of bracket flat-plate portions which extend from the pair of bracket side-wall portions, respectively, in the direction toward the connector main body, and
      a pair of bracket fixing-plate portions which extend from the pair of bracket side-wall portions, respectively, in a direction away from the connector main body.

2. The waterproof connector according to claim 1, further comprising a flanged fastener configured to fix the bracket to the housing,
   wherein the bracket has a bracket fastener hole into which the flanged fastener is to be inserted,
   wherein movement of the annular seal member along the housing sealing surface with respect to the bracket is restricted, and
   wherein, when a positional shift amount between a center of the connector main body and a center of the housing connector hole in the direction along the housing sealing surface is represented by X, an outer diameter of a shaft portion of the flanged fastener is represented by D1, a diameter of the bracket fastener hole is represented by D2, and an outer diameter of a flange portion of the flanged fastener is represented by D3, conditions $X<(D2-D1)/2$ and $D2<D3$ are satisfied.

3. The waterproof connector according to claim 1, further comprising:
   a fastener configured to fix the bracket to the housing; and
   a washer, being provided between a head portion of the fastener and the bracket,
   wherein the bracket has a bracket fastener hole into which the fastener is to be inserted,
   wherein movement of the annular seal member along the housing sealing surface with respect to the bracket is restricted,
   wherein, when a positional shift amount between a center of the connector main body and a center of the housing connector hole in the direction along the housing sealing surface is represented by X, an outer diameter of a shaft portion of the fastener is represented by D1, a diameter of the bracket fastener hole is represented by D2, an inner diameter of the washer is represented by D4, an outer diameter of the head portion of the fastener is represented by D5, and an outer diameter of the washer is represented by D6, conditions $X<(D2-D1)/2$ and $D4<D5<D2<D6$ are satisfied.

4. The waterproof connector according to claim 1, further comprising an outer seal holding member configured to hold the annular seal member,
   wherein movement of the annular seal member in the direction along the housing sealing surface with respect to the outer seal holding member is restricted,
   wherein the outer seal holding member has a pair of outer holding member side-wall portions, which sandwich the annular seal member in the direction along the housing sealing surface,
   wherein the pair of bracket side-wall portions sandwiches the outer seal holding member in the direction along the housing sealing surface,
   and
   wherein, when a positional shift amount between a center of the connector main body and a center of the housing connector hole in the direction along the housing sealing surface is represented by X, a dimension of the outer seal holding member in the direction along the housing sealing surface is represented by L1, and a dimension between the pair of bracket side-wall portions is represented by L2, a condition $X<(L2-L1)/2$ is satisfied.

5. The waterproof connector according to claim 4,
   wherein the outer seal holding member has a pair of outer holding member flat-plate portions, which are provided to the pair of outer holding member side-wall portions, respectively, and extend from the pair of outer holding member side-wall portions toward the connector main body, and
   wherein, when a dimension between the pair of outer holding member flat-plate portions is represented by M1 and a dimension between the pair of bracket flat-plate portions is represented by M2, a condition M1<M2 is satisfied.

6. The waterproof connector according to claim 4, further comprising an inner seal holding member provided between the annular seal member and the housing,
wherein the movement of the annular seal member in the direction along the housing sealing surface with respect to the outer seal holding member is restricted,
wherein the annular seal member has a pair of housing sealing surface contact portions, which sandwich the inner seal holding member in the direction along the housing sealing surface, and are held in contact with the housing sealing surface,
wherein the inner seal holding member has a pair of inner holding member flat-plate portions, which sandwich the connector main body in the direction along the housing sealing surface, and
wherein, when a dimension between the pair of inner holding member flat-plate portions is represented by M3, a dimension of the housing connector hole is represented by M4, a dimension of the inner seal holding member in the direction along the housing sealing surface is represented by M5, and a dimension between the pair of housing sealing surface contact portions is represented by M6, a condition M3<M4<M5<M6 is satisfied.

7. The waterproof connector according to claim 6,
wherein the pair of inner holding member flat-plate portions have a pair of tapered surfaces on a side opposite to the connector main body, respectively, the pair of tapered surfaces approaching the connector main body in a direction toward the housing, and
wherein the annular seal member has a groove into which the pair of tapered surfaces are to be inserted.

8. The waterproof connector according to claim 6,
wherein the pair of inner holding member flat-plate portions have through holes penetrating in a thickness direction of the pair of inner holding member flat-plate portions, respectively, and
wherein the annular seal member includes a seal member main body and protruding portions, which are formed integrally with the seal member main body, and are to be fitted into the through holes, respectively.

9. The waterproof connector according to claim 1, wherein, when a positional shift amount between a center of the connector main body sealing surface and a center of the annular seal member in a direction perpendicular to the housing sealing surface is represented by Z, a dimension of a portion of the annular seal member, which is held in contact with the connector main body sealing surface, in the direction perpendicular to the housing sealing surface is represented by S1, and a dimension of the connector main body sealing surface in the direction perpendicular to the housing sealing surface is represented by S2, a condition Z<(S2-S1)/2 is satisfied.

10. The waterproof connector according to claim 1,
wherein the annular seal member includes a first seal member to be held in contact with the connector main body sealing surface and a second seal member to be held in contact with the housing sealing surface, and
wherein the first seal member and the second seal member are separated from each other.

11. The waterproof connector according to claim 10, further comprising an outer seal holding member configured to hold the annular seal member,
wherein the outer seal holding member has a pair of first seal member holding side-wall portions, which sandwich the first seal member in the direction along the housing sealing surface, and
wherein the outer seal holding member has a second seal member accommodation groove in which the second seal member is to be accommodated.

12. A waterproof connector comprising:
a connector main body, which is mounted on a circuit board provided inside a housing, and is to be inserted into a housing connector hole formed in the housing;
an annular seal member, which is provided outside the housing, and surrounds the connector main body; and
a bracket, which is provided to the housing, and is configured to press the annular seal member against the housing,
wherein the annular seal member is held in contact with a connector main body sealing surface of the connector main body and a housing sealing surface of the housing to close a gap between the housing and the connector main body, and
wherein the waterproof connector further comprises:
a pair of bosses, which are provided to the housing, and sandwich the annular seal member in a direction along the housing sealing surface; and
fasteners, which are provided to the pair of bosses, respectively, and are configured to fix the bracket to the pair of bosses,
wherein the bracket has a pair of bracket flat-plate portions, which are provided to the pair of bosses, respectively, and extend from the pair of bosses toward the connector main body.

13. A method of assembling a waterproof connector, the method comprising:
a circuit board installation step of installing a circuit board inside a housing so that a connector main body is inserted into a housing connector hole formed in the housing;
an annular seal member installation step of, after the circuit board installation step, installing an annular seal member on the housing so that the annular seal member is brought into contact with a connector main body sealing surface of the connector main body and a housing sealing surface of the housing to close a gap between the housing and the connector main body; and
an annular seal member pressing step of, after the annular seal member installation step, installing a bracket onto the housing to press the annular seal member against the housing,
wherein the installing the bracket includes:
providing a pair of bracket side-wall portions which extend at outer sides of the annular seal member, respectively, to sandwich the outer sides of the annular seal member in a direction toward the connector main body sealing surface along the housing sealing surface,
providing a pair of bracket flat-plate portions which extend from the pair of bracket side-wall portions, respectively, in the direction toward the connector main body, and
providing a pair of bracket fixing-plate portions which extend from the pair of bracket side-wall portions, respectively, in a direction extending away from the connector main body.

* * * * *